United States Patent
Guo et al.

(10) Patent No.: US 11,810,828 B2
(45) Date of Patent: Nov. 7, 2023

(54) TRANSISTOR BOUNDARY PROTECTION USING REVERSIBLE CROSSLINKING REFLOW

(71) Applicant: International Business Machines Corporation, Armonk, NY (US)

(72) Inventors: Jing Guo, Niskayuna, NY (US); Ekmini Anuja De Silva, Slingerlands, NY (US); Indira Seshadri, Niskayuna, NY (US); Jingyun Zhang, Albany, NY (US); Su Chen Fan, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 17/368,368

(22) Filed: Jul. 6, 2021

(65) Prior Publication Data
US 2023/0026989 A1     Jan. 26, 2023

(51) Int. Cl.
*H01L 21/8238*     (2006.01)
*H01L 21/3213*     (2006.01)
(52) U.S. Cl.
CPC ......... *H01L 21/823842* (2013.01); *H01L 21/32134* (2013.01)
(58) Field of Classification Search
None
See application file for complete search history.

(56) References Cited

U.S. PATENT DOCUMENTS

| | | | |
|---|---|---|---|
| 9,177,874 B2 | 11/2015 | Patzer et al. | |
| 9,362,120 B2 | 6/2016 | Su | |
| 9,671,694 B1 | 6/2017 | Glodde et al. | |
| 9,768,022 B2 | 9/2017 | Weng et al. | |
| 10,008,418 B2 | 6/2018 | Yu et al. | |
| 10,103,065 B1* | 10/2018 | Mochizuki | H01L 21/823878 |
| 10,332,746 B1 | 6/2019 | Yu et al. | |
| 10,361,199 B2 | 7/2019 | Balakrishnan et al. | |
| 10,388,510 B2 | 8/2019 | De Silva et al. | |
| 10,741,454 B2 | 8/2020 | Guo et al. | |
| 11,069,580 B2* | 7/2021 | Mun | H01L 29/78696 |
| 2019/0295841 A1 | 9/2019 | De Silva et al. | |
| 2020/0051872 A1* | 2/2020 | Guo | H10B 12/056 |

OTHER PUBLICATIONS

Cho et al., "Si FinFET based 10nm Technology with Multi Vt Gate Stack for Lower Power and High Performance Applications," 2016 Symposium on VLSI Technology Digest of Technical Papers, © 2016 IEEE, 2 pgs.

* cited by examiner

*Primary Examiner* — Benjamin P Sandvik
(74) *Attorney, Agent, or Firm* — Robert Shatto

(57) ABSTRACT

Methods are presented for forming multi-threshold field effect transistors. The methods generally include depositing and patterning an organic planarizing layer to protect underlying structures formed in a selected one of the nFET region and the pFET region of a semiconductor wafer. In the other one of the nFET region and the pFET region, structures are processed to form an undercut in the organic planarizing layer. The organic planarizing layer is subjected to a reflow process to fill the undercut. The methods are effective to protect a boundary between the nFET region and the pFET region.

19 Claims, 15 Drawing Sheets

TRANSISTOR BOUNDARY PROTECTION USING REVERSIBLE CROSSLINKING REFLOW

BACKGROUND

The present invention relates in general to semiconductor fabrication methods and resulting structures. More specifically, the present invention relates to complementary metal oxide semiconductor (CMOS) boundary protection for field effect transistors.

In an integrated circuit, transistors such as metal oxide semiconductor field effect transistors (MOSFETs) have a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode. Multi-threshold CMOS (MTCMOS) is a variation of CMOS chip technology that has transistors with multiple threshold voltages (Vth) in order to optimize delay or power.

SUMMARY

Embodiments of the present invention include fabrication methods and the corresponding structures. In some embodiments, the fabrication method comprises conformally depositing a work function metal over channel structures provided in an nFET region and a pFET region of a semiconductor device. The method further comprises depositing and patterning an organic planarizing layer to block the channel structures in a selected one of the nFET region and the pFET region. The method further comprises removing a nominal thickness of the work function metal from the other one of the nFET and pFET region. Removing the nominal thickness laterally removes a portion of the work function metal to form an undercut in the organic planarizing layer. The method further comprises reflowing the organic planarizing layer to fill the undercut and completely cover the work function metal underlying the organic planarizing layer by irradiating the organic planarizing layer. The method further comprises fully removing a remaining portion of work function metal from the other one of the nFET region and the pFET region. Fully removing the remaining work function metal does not remove any additional amount of the work function metal underlying the organic planarizing layer.

Additional embodiments include a method for protecting a boundary between an nFET region and a pFET region in a semiconductor device and the corresponding structures. The method comprises depositing and patterning a UV sensitive organic planarizing layer to protect underlying structures formed in a selected one of the nFET region and the pFET region. The method further comprises processing structures in the other one of the nFET region and the pFET region to form an undercut in the organic planarizing layer. The method further comprises reflowing the UV sensitive organic planarizing layer to fill the undercut. Reflowing comprises exposing the UV sensitive organic planarizing layer to activating radiation effective to decrosslink the UV sensitive organic planarizing layer.

Additional embodiments include a method for protecting a boundary between an nFET region and a pFET region in a semiconductor device and the corresponding structures. The method comprises depositing a first organic planarizing layer over underlying structures formed in a first portion of the semiconductor device. The method further comprises depositing a second organic planarizing layer over underlying structures formed in a second portion of the semiconductor device. The method further comprises patterning the first and second organic planarization layers to remove the first and second organic planarization layers from one of an nFET region or a pFET region in each of the first and second portions of the semiconductor device. The method further comprises processing structures in an other one of the nFET region or the pFET region in each of the first and second portions of the semiconductor device to form an undercut in the first and second organic planarizing layers. The method further comprises reflowing the organic planarizing layers to fill the undercuts. Reflowing comprises decrosslinking the organic planarizing layers by exposing the organic planarizing layer to activating radiation in an amount effective to cause the decrosslinking and reflow of the organic planarizing layers.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
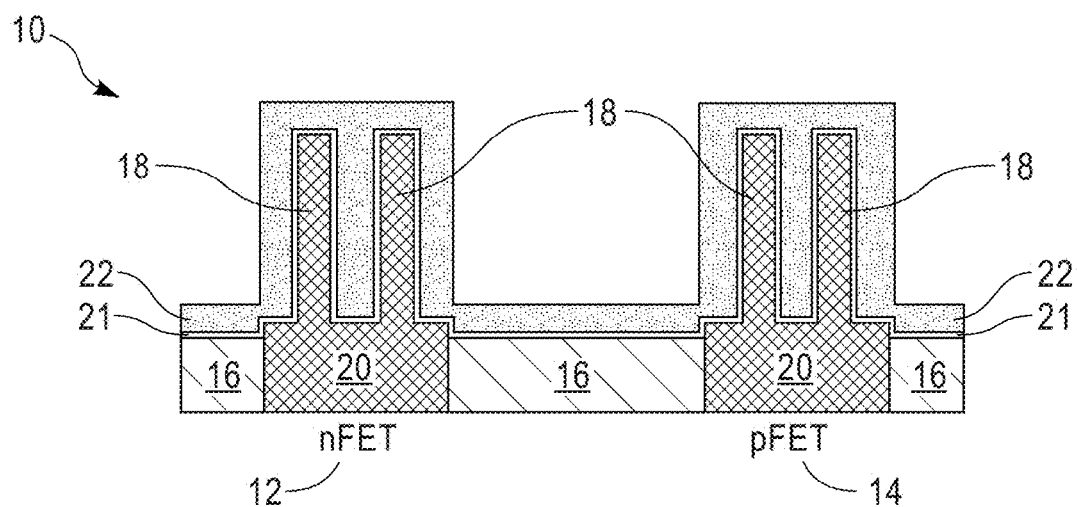
FIG. 1 is a cross-sectional view depicting a semiconductor structure at an intermediate stage of the manufacturing process, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Embodiments of the present invention are generally directed to boundary protection during fabrication of n-type doped field effect transistors and p-type doped field effect transistors for a multi-threshold complementary metal oxide semiconductors (MTCMOS). While the present disclosure is not necessarily limited to such applications, various aspects of the disclosure may be appreciated through a discussion of various examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a vertical transistor refers to a vertical transport field effect transistor (VFET) having, for example, a vertically oriented (i.e., away from the substrate) fin, or a nanowire or nanosheet transistor (e.g., a vertical nanowire transistor, such as a junctionless nanowire transistor), with a bottom source/drain disposed below the fin or nanowire (e.g., between the fin and the substrate) and a top source/drain disposed on the top of the fin or nanowire (opposite the bottom source/drain). VFETs are commonly used in high performance applications in complementary metal-oxide-semiconductor (CMOS) technology. Metal gates for the VFET may be disposed on the sides of the fin or nanowire, with a thin insulating dielectric material sitting between the gate and the fin or nanowire. The thin insulating dielectric layer is typically made from silicon oxide, silicon nitride, or high K dielectric materials, such as $Al_2O_3$, $HfO_2$, $ZrO_2$ or a combination of these, deposited by chemical vapor deposition (CVD), for example.

At tight pitches, boundary protection between the n-type doped field effect transistor (nFET) region and the p-type doped field effect transistors (pFET) region during deposition of the n-type doped work function metals and the p-type doped work function metals (WFM) in the respective regions is an issue due to edge placement accuracy. Inaccurate edge placement leads to unwanted removal of the work function metal material in the blocked regions during fabrication, wherein the work function metal can be responsible for setting the threshold voltage in the MTCMOS devices.

Embodiments of the present invention generally include controlled reflow of an organic planarization layer (i.e., the block mask) during masking and etching of the WFM in the nFET or pFET region. By way of example, trilayer including an organic planarization layer can be patterned and used to mask the pFET region during formation of the p-type WFM in the pFET region. A wet etch process is utilized to remove a portion of the WFM having a nominal thickness from an nFET region. The block mask provided by the patterned organic planarizing layer serves to protect the pFET region during the wet etch process to remove the p-type WFM from the nFET region. However, patterning the organic planarization layer exposes a sidewall portion of the p-type WFM in the pFET region. As a result, removing the nominal thickness of the p-type WFM from the nFET regions by the wet etch process laterally etches the exposed portion of the p-type WFM underlying the organic planarizing layer in the pFET region, resulting in undercutting of the organic planarizing layer.

In order to prevent undercutting of the WFM in the pFET region, following removal of the nominal thickness of the p-type WFM from the nFET region, the organic planarization layer is subjected to a reflow step so as to cover and protect the exposed portion of the p-type WFM in the pFET region. Reflow of the organic planarization layer subsequent to nominal thickness removal of the WFM permits full removal of the p-type WFM in the nFET region without additional lateral etch of the work function metal in the pFET region, thereby protecting the n/p boundary during complete removal of the WFM from the nFET region. For example, the p-type WFM can be removed between vertically oriented fins in the nFET regions of a VFET structure, thereby minimizing the amount of lateral etch.

Reflow of the organic planarization layer (OPL) is not intended to be limited and can be performed by applying light having specific wavelengths to the OPL, depending on the material used. For example, in some embodiments, reflow of the OPL comprises applying UV light having a first wavelength (e.g., 256 nm) to cause the OPL to effectuate decrosslinking of the OPL. Light having a second wavelength (e.g., 365 nm) can be used to re-crosslink the OPL to stop the OPL from flowing. In some embodiments, in addition to utilizing UV light, a soft bake operation may be performed to expedite the reflow of the OPL. The controlled reflow of the OPL subsequent to WFM nominal thickness etching in the nFET region is applicable to different CMOS transistors such as, for example, fin field effect transistors (FinFET), nanosheet FETs, or vertical finFETs (VFETs).

As used herein, the term "nominal thickness" generally refers a thickness of the WFM deposited on the horizontal surfaces of the substrate.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

It should also be understood that material compounds will be described in terms of listed elements, e.g., SiN, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

FIGS. 1-8 depict a reflow process for providing boundary protection during fabrication of the nFET region and the pFET region for multi-threshold VFETs. Turning now to FIG. 1, there is shown a cross section of an exemplary intermediate CMOS transistor structure 10 including vertical fins for forming VFETs. The illustrated transistor structure 10 includes an nFET region 12 and a pFET region 14, in accordance with one or more embodiments. The nFET region 12 and the pFET region 14 are separated by a shallow trench isolation region 16 formed of an oxide, for example. The illustrated nFET and pFET regions 12, 14 include vertically oriented fins 18 (two of which are shown in each region) extending from a base substrate 20. Although two fins in each region are shown, this is done for illustrative purposes only. Fewer than or greater than the two fins can be present as can be desired for different nFET and pFET VFET structures.

A dielectric layer 21 and p-type work function metal 22 are conformally deposited onto the structure 10.

The base substrate 20 can include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The base substrate 20 can also include an organic semiconductor or a layered semiconductor such as, for example, Si/SiGe, a silicon-on-insulator, or a SiGe-on-insulator. A portion of or the entire semiconductor substrate 20 can be amorphous, polycrystalline, or monocrystalline. In addition to the aforementioned types of semiconductor substrates, the base substrate 20 employed in the present disclosure can also include a hybrid oriented (HOT) base substrate in which the HOT substrate has surface regions of different crystallographic orientation. The base substrate 20 can be doped, undoped, or contain doped regions and undoped regions therein. The base substrate can contain regions with strain and regions without strain therein, or it can contain regions of tensile strain and compressive strain.

Each semiconductor fin 18 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch step can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In one or more embodiments, each semiconductor fin 18 can be formed utilizing a SIT (sidewall image transfer) process. In a typical SIT process, spacers are formed on sidewall surfaces of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 18 has been formed. In another embodiment, sequential SIT processes can be utilized to form fins with highly scaled fin width and pitches.

The number and size of fin channels to be formed can be based on the intended current handling capacity of the electronic device structure. Formation of the fin channels generally includes deposition and lithographic patterning of a hardmask layer followed by an anisotropic etching process. Because there is no stop layer on the base substrate 20, the etch process can be time-based. A suitable anisotropic etching process includes reactive ion etching. The height of the fin channels 18 in the z direction can be in the range of about 30 nanometers (nm) to about 400 nm, or in the range of about 50 nm to about 300 nm, or in the range of about 75 nm to about 200 nm. In various embodiments, the width of the fin channels in the x direction can be in the range of about 5 nm to about 30 nm, or about 10 nm to about 20 nm. In various embodiments, the aspect ratio of the fin channels can be in the range of about 3 to about 40, or in the range of about 5 to about 20, or in the range of about 7 to about 10. In various embodiments, the fin channels can have a length in they direction in the range of about 10 nm to about 2000 nm, or in the range of about 20 nm to about 1000 nm, or in the range of about 25 nm to about 500 nm, where the length in the y direction is greater than the width in the x direction.

The hardmask (not shown) can include, for example, silicon oxide, silicon nitride (SiN), or any suitable combination of those. The hardmask can be deposited using a deposition process that includes, but is not limited to, PVD, CVD, PECVD, or any combination thereof.

The illustrated structure 10 can further include a bottom spacer layer (not shown), which can be deposited by any non-conformal deposition methods that provides a faster deposition rate on the planar surface and slower deposition rate on the sidewall surface including, but not limited to, plasma vapor deposition (PVD), high density plasma (HDP) deposition or the like. The bottom spacer layer can be disposed between the vertically oriented fin structures. The PVD or HDP process is highly directional and deposits the spacer onto the bottom of the trenches but less on fin sidewall. After directional deposition of bottom spacer, an etch-back process can be performed to remove the any residue of spacer materials from a sidewall of the fin 18. In PVD, a pure source material is gasified via evaporation, the application of high power electricity, laser ablation, or the like. The gasified material will then condense on the substrate material to create the desired layer. The bottom spacer can be a low k dielectric material. The term "low k dielectric" generally refers to an insulating material having a dielectric constant less than silicon dioxide (i.e., less than 3.9). Exemplary low k dielectric materials include, but are not limited to, dielectric nitrides (e.g., silicon nitride, SiBCN), dielectric oxynitrides (e.g., SiOCN), SiCN, or any combination thereof or the like. In one or more embodiments, the bottom spacer layer can have a thickness in the range of about 3 nm to about 10 nm, or in the range of about 3 nm to about 5 nm.

It should be apparent that the bottom spacer layer can be formed adjacent to the bottom source or drain regions (e.g., drain regions as well as the source regions for the completed VFETs), which are not shown. The source/drain regions can be formed by an epitaxial growth process that deposits a crystalline semiconductor material onto selected areas of the substrate 20 to form the bottom source/drain region. By way of example, the bottom source/drain regions for pFETs can be formed of SiGe:B, and bottom source/drain regions for nFETs can be formed of Si:P. The epitaxial growth process can include epitaxial materials grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain generally can range from about $1 \times 10^{19}$ cm$^{-3}$ to about $2 \times 10^{21}$ cm$^{-3}$, or, in other embodiments, from about $2 \times 10^{20}$ cm$^{-3}$ to about $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The fin 18 can be laterally etched to thin the fin channel to a desired width. Lateral thinning of the fin channel can be effected by an isotropic etch process. As such, the hardmask can have a width dimension greater than a width dimension of the fin.

The high k dielectric material 21 is conformally deposited onto the structure followed by conformal deposition of a work function metal gate material 22.

The high k gate dielectric material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 nm to about 20 nm.

The work function metal(s) 22 can be conformally deposited over the high k gate dielectric material. The type of work function metal(s) depends on the type of transistor and can differ between the nFET and pFET devices. Non-limiting examples of suitable work function metals include p-type work function metal materials and n-type work function metal materials. P-type work function materials include compositions such as titanium nitride, tantalum nitride, ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

By way of example, a p-type work function material 22 of titanium nitride (TiN) is deposited onto the structure 10. The thickness of the work function metal can be about 1 nm to about 10 nm.

Figure 2:
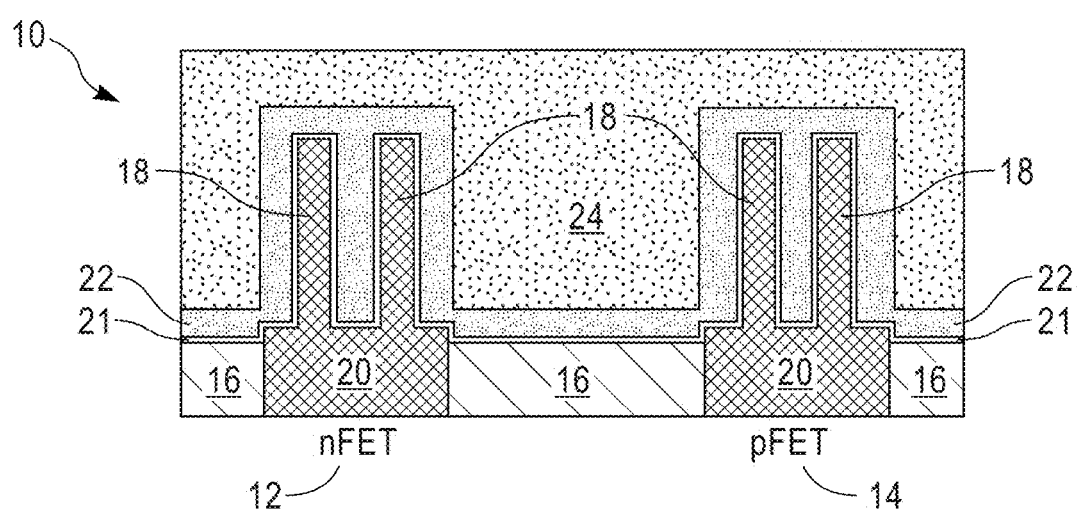
FIG. 2 is a cross-sectional view depicting the semiconductor structure of FIG. 1 after one or more additional fabrication operations, in accordance with embodiments of the present disclosure.

In the cross sectional view of FIG. 2, an OPL 24 is deposited onto the structure. The OPL 24 can be deposited using a spin coat process. In some embodiments, the OPL 24 can then be subjected to a crosslinking operation. For example, embodiments of the present disclosure utilize "UV sensitive" OPL materials with reversible de-crosslinking properties. A "UV sensitive" OPL material, as used herein, refers to an OPL that can be reversibly crosslinked (and de-crosslinked) by exposing the OPL to specific UV frequencies or wavelengths. In other words, these UV sensitive OPL materials can be crosslinked using a first frequency/wavelength and de-crosslinked using a second frequency/wavelength. As such, UV light (e.g., at 365 nm) may be applied to the OPL 24 to cause the OPL 24 to crosslink. It is to be understood that other wavelengths of light (i.e., electromagnetic radiation) may be used, depending on the OPL 24 material. For example, in some embodiments, UV light having a different wavelength may be used to cause the OPL 24 to crosslink. In some embodiments, electromagnetic radiation in a different part of the electromagnetic spectrum (i.e., not UV light) may be applied to cause the OPL 24 to crosslink.

Figure 3:
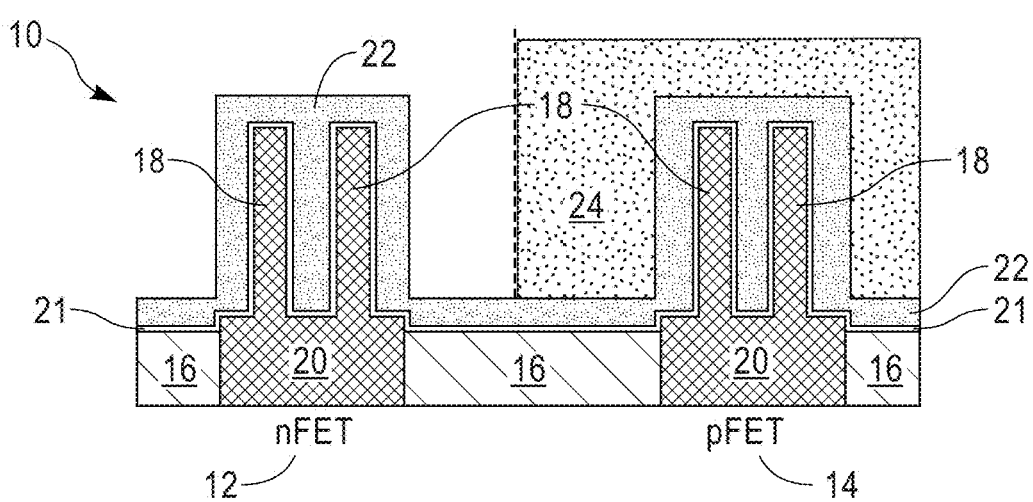
FIG. 3 is a cross-sectional view depicting the semiconductor structure of FIG. 2 after one or more additional fabrication operations, in accordance with embodiments of the present disclosure.

The OPL 24 can be lithographically patterned to protect the pFET region 14 during processing of the nFET region 12 using a hard mask and photoresist layer thereon. The OPL 24 after patterning is shown in FIG. 3. As shown in FIG. 3, the OPL 24 has been removed from the nFET region 12 and is only present in the pFET region 14.

Figure 4:
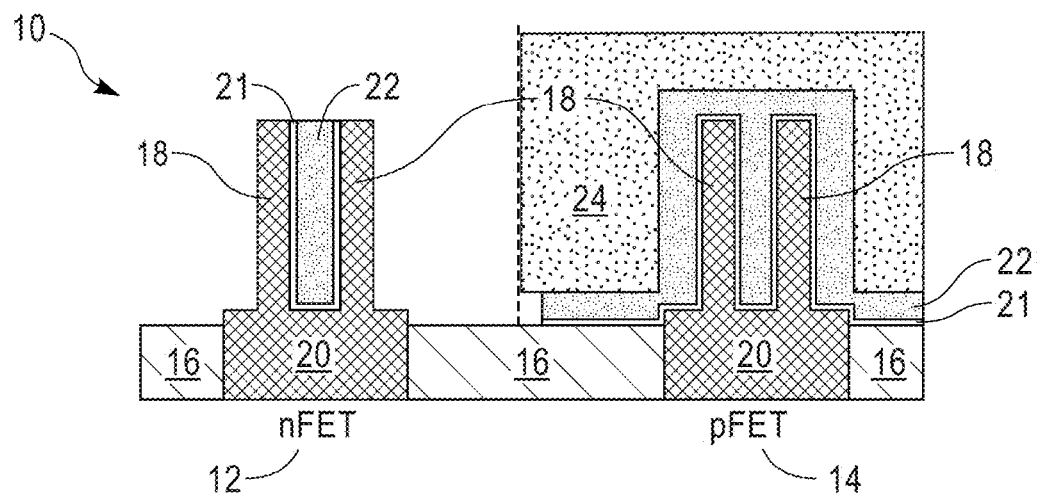
FIG. 4 is a cross-sectional view depicting the semiconductor structure of FIG. 3 after one or more additional fabrication operations, in accordance with embodiments of the present disclosure.

FIG. 4 illustrates the VFET structure of FIG. 3 subsequent to removal of a nominal thickness of the work function metal 22 (and high k dielectric layer 21) from the nFET region 12. The nominal thickness refers to the thinnest thickness of the work function metal whereas the thickness between the fins is significantly greater. Nominal thickness removal of the exposed portions of the work function metal in the nFET region 12 can be effected using a wet etch process. The wet etch process can include exposing the work function metal to an aqueous solution including ammonium hydroxide or hydrogen peroxide or hydrochloric acid, or combinations including at least one of the ammonium hydroxide, the hydrogen peroxide and/or the hydrochloric acid. Exemplary wet etch process include application of a standard clean SC-1 process, which generally includes exposing the substrate to an aqueous solution containing hydrogen peroxide ($H_2O_2$) and ammonium hydroxide ($NH_4OH$) at a temperature of about room temperature to about 50° C. Alternatively, a combination of the standard clean SC-1 process and a standard clean SC-2 process can be used. The standard clean SC-2 process generally includes exposing the WFM to an aqueous solution of hydrochloric acid (HCl) and $H_2O_2$. As shown, because the WFM underlying the OPL 24 includes an exposed end portion, lateral etching of the work function metal 22 occurs resulting in undercutting in the pFET region 14. The extent of the undercut is typically about 2 nm to about 10 nm.

Figure 5:
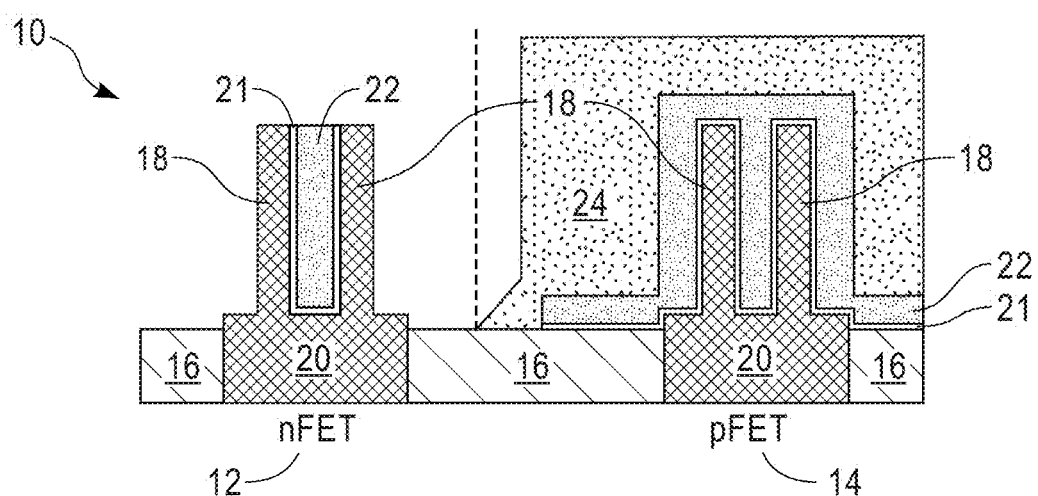
FIG. 5 is a cross-sectional view depicting the semiconductor structure of FIG. 4 after one or more additional fabrication operations, in accordance with embodiments of the present disclosure.

FIG. 5 illustrates the VFET structure of FIG. 4 subsequent to reflowing the OPL 24 so as to advantageously prevent further lateral etch of the work function metal 22 in the pFET region 14. As noted above, reflow of the organic planarizing layer can be effected by exposing the OPL 24 to activating electromagnetic radiation. In some embodiments, a soft bake operation may also be performed by heating the OPL 24. This may occur simultaneous with the electromagnetic radiation application, or it may occur after. Heating the OPL 24 may further expedite the reflow process of the decrosslinked OPL 24. The reflow of the OPL 24 is in an amount effective to completely cover the exposed portion of the work function metal 22 in the pFET region 14, as shown.

The organic planarizing material is selected to reflow upon exposure to activating electromagnetic energy. UV decrosslinkable functionalities provide decrosslinking reactions at wavelengths such as 365 nm and 248 nm. Exemplary UV decrosslinking functionalities are provided below:

a)

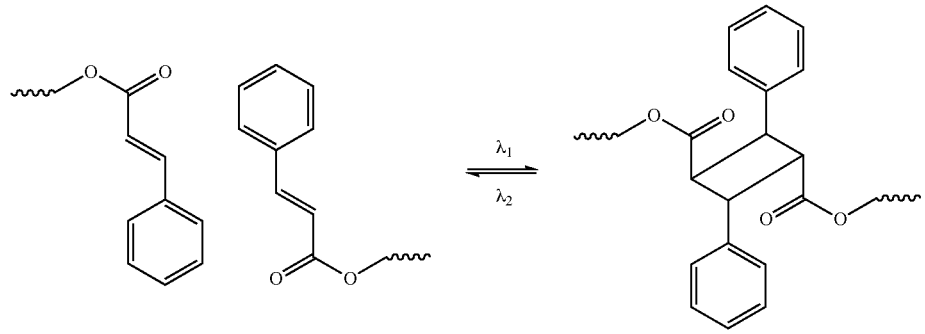

b)

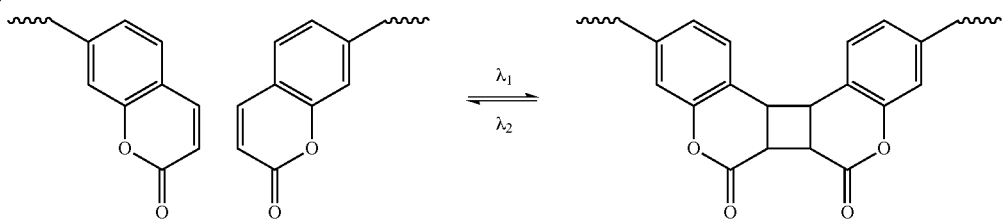

c)

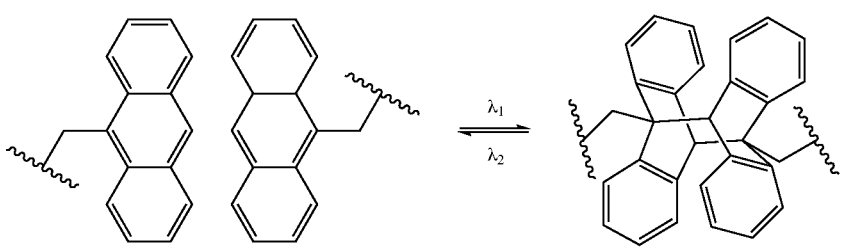

In the above diagrams, three different UV sensitive OPL materials are shown, with the structure on the left showing the material in the decrosslinked state and the structure on the right showing the material in the crosslinked state. The first UV sensitive OPL material (a) includes a cinnamoyl functional group bonded to a polymer main chain. The second UV sensitive OPL material (b) includes a coumarin functional group bonded to a polymer main chain. The third UV sensitive OPL material (c) includes an anthracene functional group bonded to a polymer main chain. These three exemplary UV sensitive OPL materials are provided for ease of discussion, and it is understood that any UV sensitive OPL material capable of a UV reversible crosslink and de-crosslink can be used in one or more embodiments of the present disclosure.

The polymer main chains can include any suitable material, such as, for example, polystyrenes, polyethylenes, polyacrylates, polyamides, polyethers, polyesters, poly(N-acetylethylenimine), polyurethanes, and polyoxazoline. The particular polymer chosen for a given application will vary and may be selected to accommodate solubility during a subsequent OPL wet strip. Moreover, the feed ratio of monomer with and without UV crosslinkable moiety could vary in order to accommodate solubility and material performance.

In some embodiments of the present invention, the first wavelength (λ1) for crosslinking the UV sensitive OPL materials is about 365 nm, although the exact crosslinking wavelength will vary depending on the OPL material used, and other wavelengths are within the contemplated scope of the invention. In some embodiments of the present invention, the second wavelength (λ2) for de-crosslinking the UV sensitive OPL materials is about 248 nm, although the exact de-crosslinking wavelength will vary depending on the OPL material used, and other wavelengths are within the contemplated scope of the invention.

After the reflow process has completed and the OPL 24 has flowed such that the work function metal 22 is protected, the OPL 24 may be re-crosslinked so as to "set" the OPL 24. Re-crosslinking the OPL 24 may include, for example, subjecting the OPL 24 to UV radiation having a 365 nm wavelength for a certain amount of time, depending on the thickness of the OPL 24 and the specific materials selected.

Figure 6:
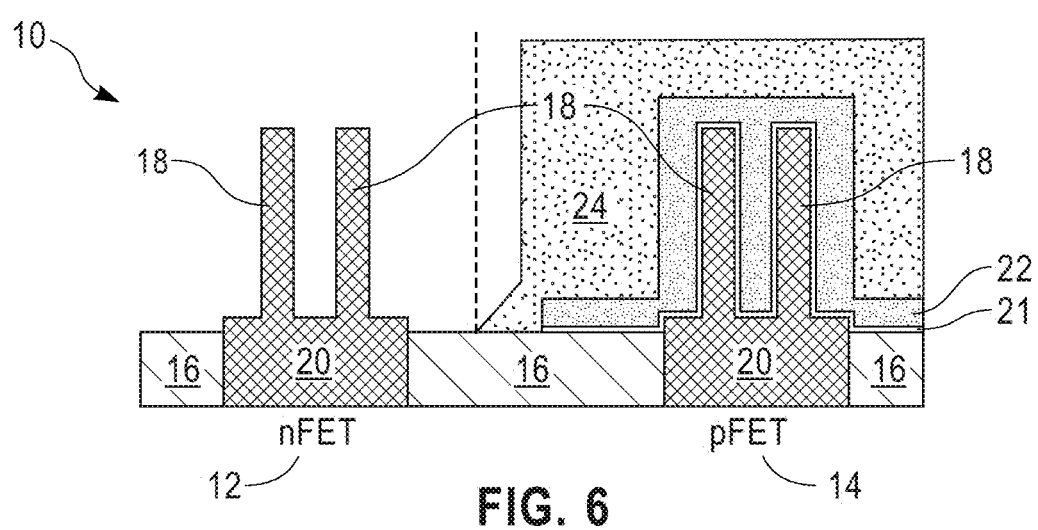
FIG. 6 is a cross-sectional view depicting the semiconductor structure of FIG. 5 after one or more additional fabrication operations, in accordance with embodiments of the present disclosure.

FIG. 6 illustrates the VFET structure of FIG. 5 subsequent to full removal of the work function metal from between the fins 18 within the nFET region 12. The work function metal 22 is completely encapsulated and protected in the pFET region 14 by the reflowed OPL 24. Without reflow of the OPL 24, the undercut can be from about 20 nm to about 40 nm.

Figure 7:
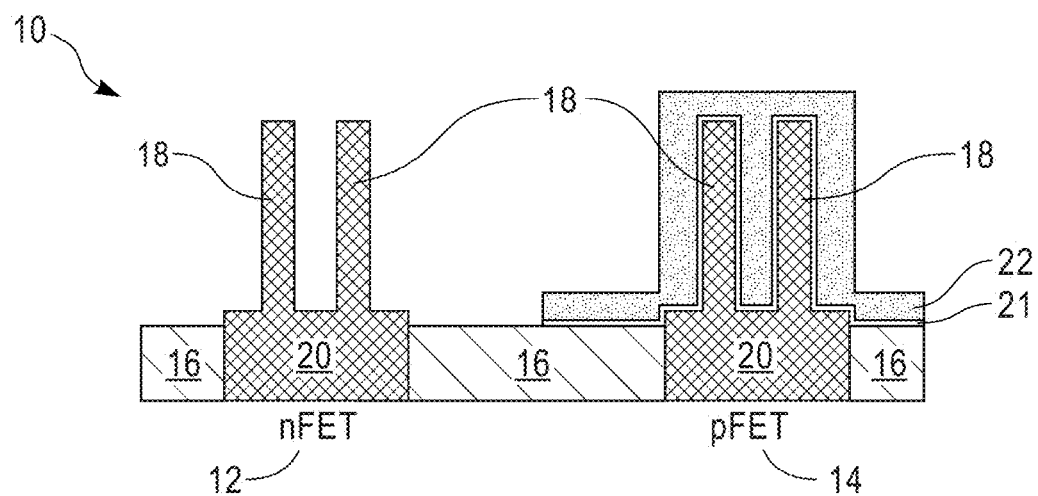
FIG. 7 is a cross-sectional view depicting the semiconductor structure of FIG. 6 after one or more additional fabrication operations, in accordance with embodiments of the present disclosure.
Figure 8:
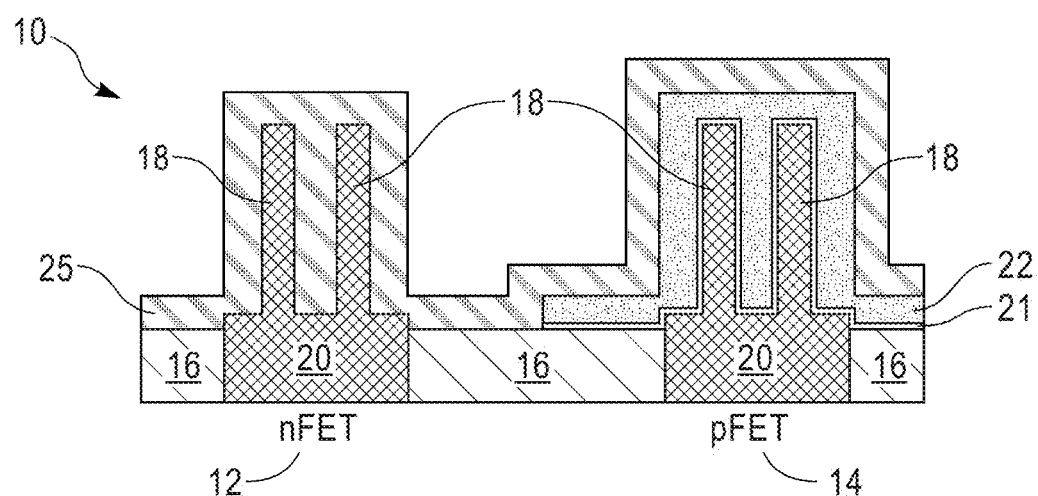
FIG. 8 is a cross-sectional view depicting the semiconductor structure of FIG. 7 after one or more additional fabrication operations, in accordance with embodiments of the present disclosure.

FIG. 7 illustrates the VFET structure of FIG. 6 subsequent to stripping the OPL 24. FIG. 8 illustrates the VFET structure of FIG. 7 subsequent to conformal deposition of an n-type WFM 25 on the nFET region 12. The nFET and pFET regions 12, 14 undergo further conventional steps to complete the respective VFETS including formation of top source/drain regions (not shown).

FIGS. 9-16 depict a reflow process for providing boundary protection during fabrication of the nFET region and the pFET region for nanosheet FETs. Numerous operations shown in FIGS. 9-16 are substantially similar to, or the same as, those shown in FIGS. 1-8. Accordingly, for the sake of brevity, a detailed discussion of the individual process are omitted except as required to explain the embodiments shown in FIGS. 9-16. Likewise, the nanosheet FETs shown in FIGS. 9-16 contain substantially similar or identical materials as discussed above with respect to the VFETs shown in FIGS. 1-8. For example, the OPL 66 (shown in FIG. 10) may be substantially the same as, or identical to, the OPL 24 discussed above with respect to FIGS. 1-8. Accordingly, a detailed description of the specific materials is omitted from the discussion of FIGS. 9-16.

Figure 9:
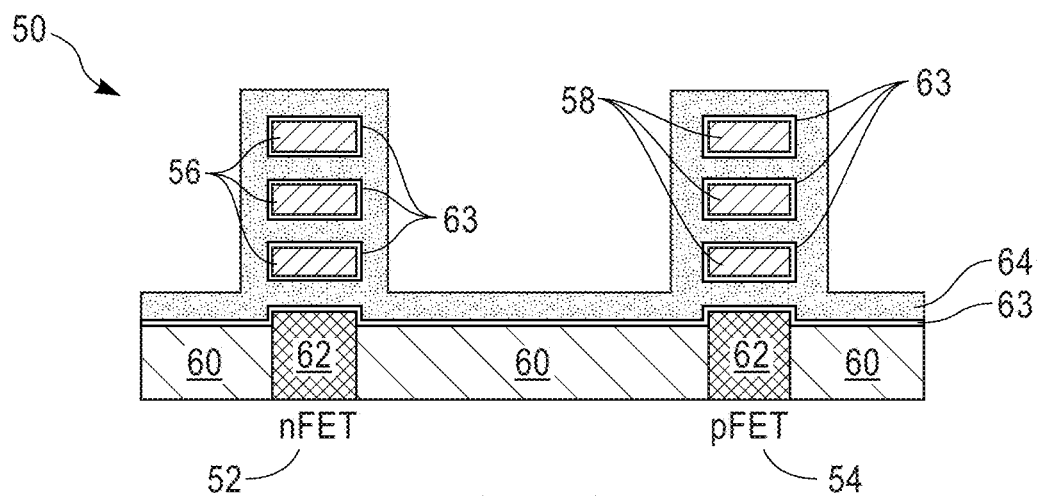
FIG. 9 is a cross-sectional view depicting a semiconductor structure at an intermediate stage of the manufacturing process, in accordance with embodiments of the present disclosure.

Turning now to FIG. 9, shown is an intermediate structure 50 including an nFET region 52 and a pFET region 54, in accordance with embodiments of the present disclosure. The structure 50 includes an epitaxially grown multilayer structure of Si and SiGe layers that can be configured and arranged such that the Si channels 56 are provided in the nFET region 52 and the SiGe channels 58 are provided in the pFET region 54. The nFET region 52 and the pFET region 54 are separated by a shallow trench isolation region 60 formed of an oxide, for example. The illustrated nFET and pFET regions 12, 14 include three nanosheets within the multilayer structure spaced apart from a base substrate 62. Although three nanosheets are depicted in each region, this is done for illustrative purposes only. As would be recognized by a person of ordinary skill, fewer than or greater than the three nanosheets can be present as can be desired for different nFET and pFET nanosheet structures. A dielectric layer 63 and p-type work function metal 64 are conformally deposited onto the structure 50.

Figure 10:
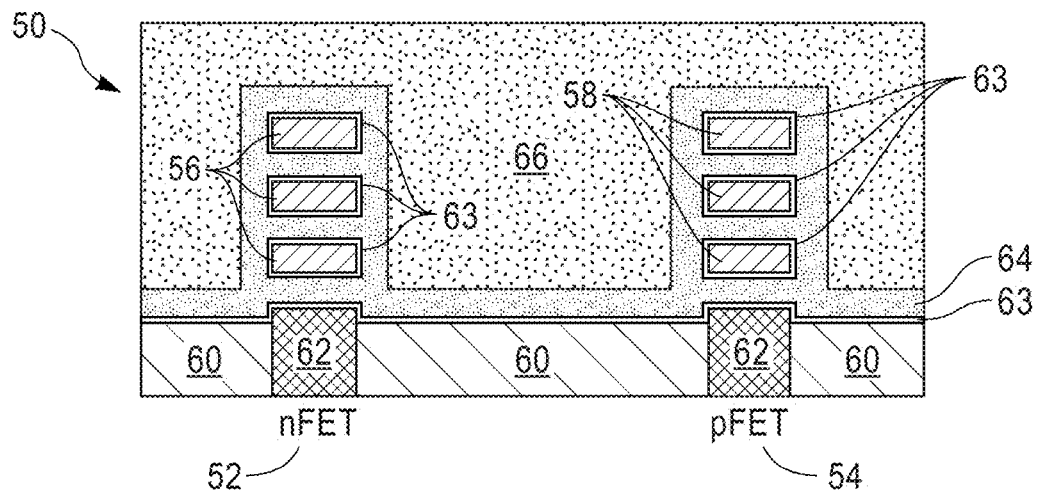
FIG. 10 is a cross-sectional view depicting the semiconductor structure of FIG. 9 after one or more additional fabrication operations, in accordance with embodiments of the present disclosure.

FIG. 10 illustrates the nanosheet FET structure of FIG. 9 subsequent to deposition of an OPL 66 onto the structure. The OPL 66 can be deposited using a spin coat process. In some embodiments, the OPL 66 can then be subjected to a crosslinking operation. For example, The OPL 66 may comprise a UV sensitive material with reversible de-crosslinking properties. As such, UV light (e.g., at 365 nm) may be applied to the OPL 66 to cause the OPL 66 to crosslink.

Figure 11:
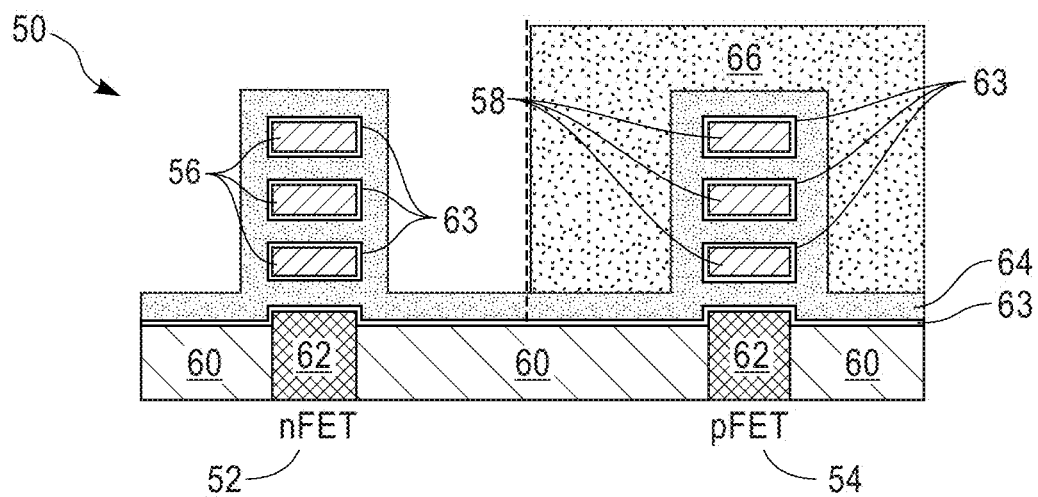
FIG. 11 is a cross-sectional view depicting the semiconductor structure of FIG. 10 after one or more additional fabrication operations, in accordance with embodiments of the present disclosure.

The OPL 66 can be lithographically patterned to protect the pFET region 54 during subsequent to processing of the nFET region 52 using a hard mask and photoresist layer thereon. The OPL 66 after patterning is shown in FIG. 11. As shown in FIG. 11, the OPL 66 has been removed from the nFET region 52 and is only present in the pFET region 54.

Figure 12:
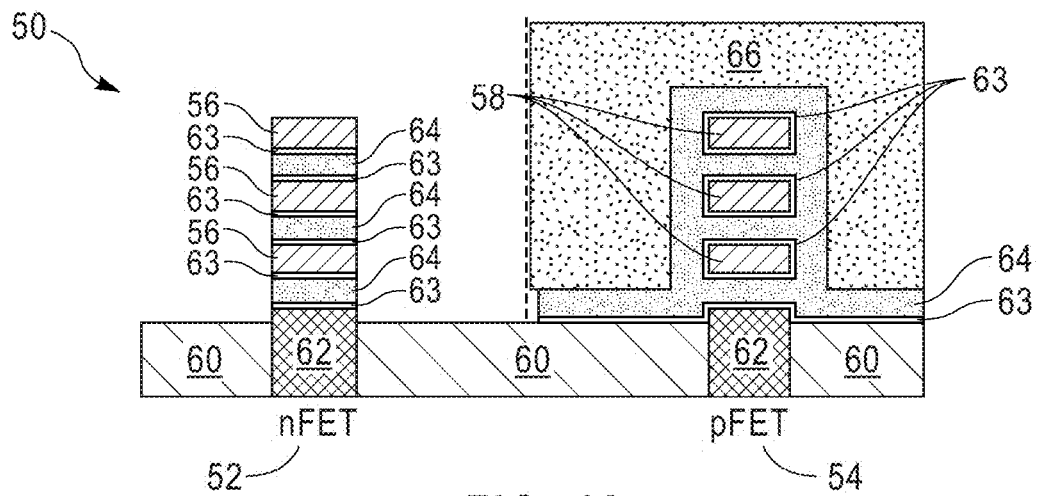
FIG. 12 is a cross-sectional view depicting the semiconductor structure of FIG. 11 after one or more additional fabrication operations, in accordance with embodiments of the present disclosure.

FIG. 12 illustrates the nanosheet FET structure of FIG. 11 subsequent to removal of a portion of the work function metal 64 (and high k dielectric layer 63) from the nFET region 52, which removes a nominal thickness deposited onto the structure. Removal of the exposed portions of the work function metal in the nFET region 52 can be effected using a wet etch process such as a standard clean SC-1 process, which generally includes exposing the substrate to an aqueous solution containing hydrogen peroxide ($H_2O_2$) and ammonium hydroxide ($NH_4OH$) at a temperature of about room temperature to about 50° C. The removal process can further include exposing the substrate to a $H_2O_2$ solution at an elevated temperature followed by exposing the substrate to the SC-1 aqueous solution for a second time. Alternatively, a combination of the standard clean SC-1 process and a standard clean SC-2 process at an elevated temperature can be used. The standard clean SC-2 process generally includes exposing the substrate to an aqueous solution of hydrochloric acid (HCl) and $H_2O_2$. As shown, because the WFM underlying the OPL 66 includes an exposed end portion, lateral etching of the work function metal 64 in the pFET region 54 occurs resulting in undercutting of the OPL 66. The extent of undercutting is about 2 nm to about 10 nm.

Figure 13:
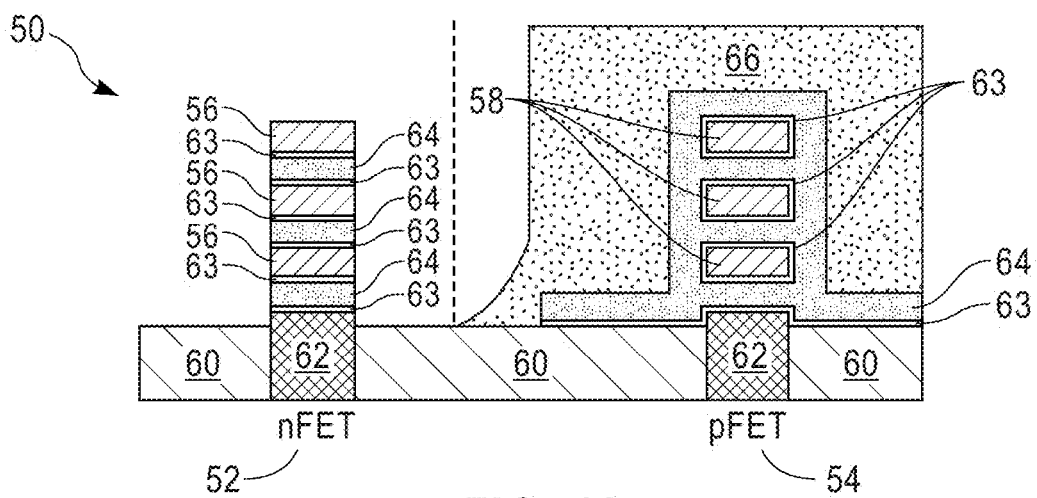
FIG. 13 is a cross-sectional view depicting the semiconductor structure of FIG. 12 after one or more additional fabrication operations, in accordance with embodiments of the present disclosure.

FIG. 13 illustrates the nanosheet FET structure of FIG. 12 subsequent to reflowing the OPL 66 so as to advantageously prevent further lateral etch of the work function metal 64 in the pFET region 54. As noted above, the OPL 66 can be a UV sensitive material, and reflow of the OPL 66 can be effected through exposure to a de-crosslinking radiation. In some embodiments, a soft bake operation may also be performed by heating the OPL 66. This may occur simultaneous with the electromagnetic radiation application, or it may occur after. Heating the OPL 66 may further expedite the reflow process of the decrosslinked OPL 66. The reflow of the organic planarization is in an amount effective to completely cover the exposed portion of the work function metal 64 in the pFET region 54, as shown.

After the reflow process has completed and the OPL 66 has flowed such that the WFM 64 in the pFET region 54 is protected, the OPL 66 may be re-crosslinked so as to "set" the OPL 66. Re-crosslinking the OPL 66 may include, for example, subjecting the OPL 66 to UV radiation having a 365 nm wavelength for a certain amount of time, depending on the thickness of the OPL 66 and the specific materials selected.

Figure 14:
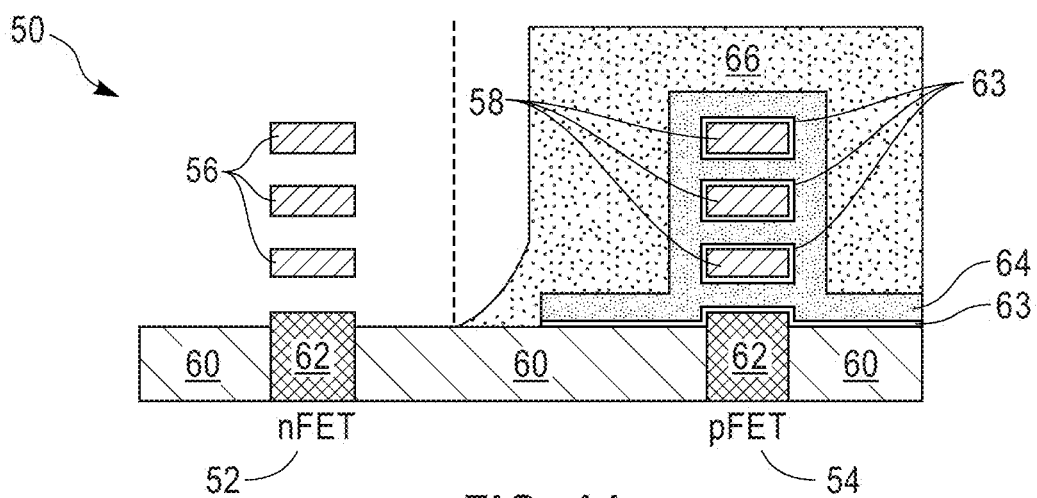
FIG. 14 is a cross-sectional view depicting the semiconductor structure of FIG. 13 after one or more additional fabrication operations, in accordance with embodiments of the present disclosure.

FIG. 14 illustrates the nanosheet FET structure of FIG. 13 subsequent to full removal of the work function metal 64 from between the nanosheets 56 within the nFET region 52. In the pFET region 54, the work function metal 64 is completely encapsulated and protected by the reflowed OPL 66. Without reflow of the OPL 66, the undercut can be from about 20 nm to about 40 nm.

Figure 15:
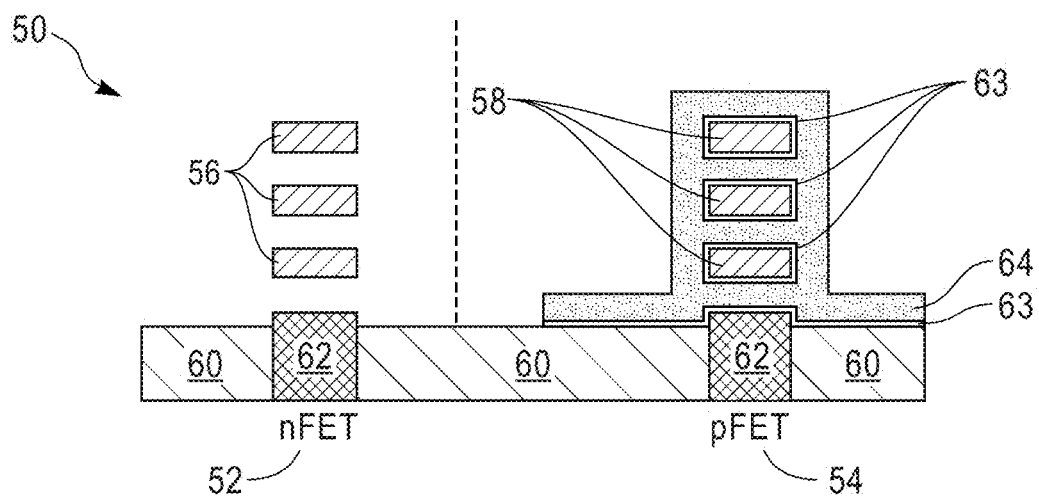
FIG. 15 is a cross-sectional view depicting the semiconductor structure of FIG. 14 after one or more additional fabrication operations, in accordance with embodiments of the present disclosure.
Figure 16:
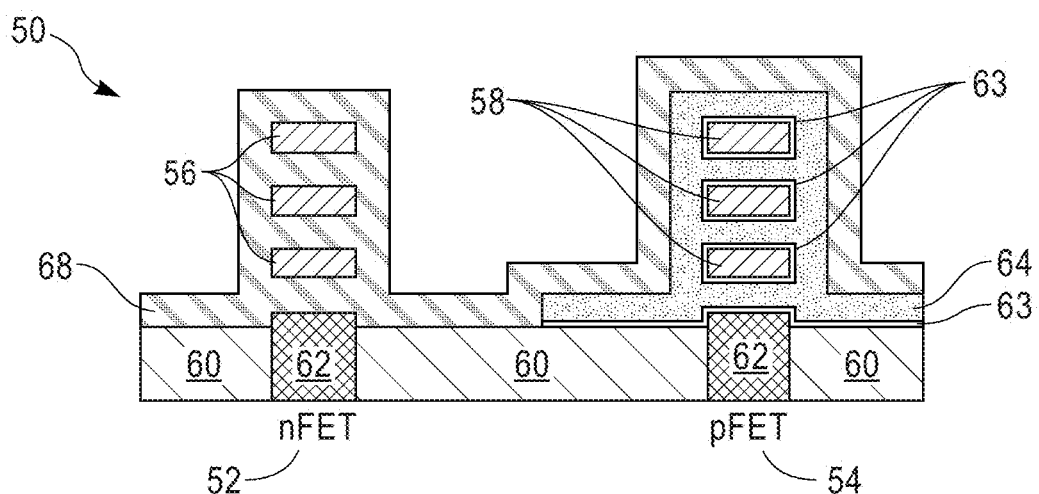
FIG. 16 is a cross-sectional view depicting the semiconductor structure of FIG. 15 after one or more additional fabrication operations, in accordance with embodiments of the present disclosure.

FIG. 15 illustrates the nanosheet FET structure of FIG. 14 subsequent to stripping the OPL 66 from the pFET region 54. FIG. 16 illustrates the nanosheet FET structure of FIG. 15 subsequent to conformal deposition of an n-type work function metal 68 on the substrate. The nFET and pFET regions 52, 54 undergo further conventional fabrication steps to complete the respective nanosheet FETs, including formation of top source/drain regions (not shown).

FIGS. 17-25 depict a reflow process for providing boundary protection during fabrication of the nFET region and the pFET region for nanosheet FETs. Numerous operations shown in FIGS. 17-25 are substantially similar to, or the same as, those shown in FIGS. 9-16. Accordingly, for the sake of brevity, a detailed discussion of the individual process are omitted except as required to explain the embodiments shown in FIGS. 17-25. Likewise, the nanosheet FETs shown in FIGS. 17-25 contain substantially similar or identical materials as discussed above with respect to the VFETs shown in FIGS. 1-8. For example, the first OPL 116 (shown in FIG. 17) may be substantially the same as, or identical to, the OPL 24 discussed above with respect to FIGS. 1-8. Accordingly, a detailed description of the specific materials is omitted from the discussion of FIGS. 17-25.

Figure 17:
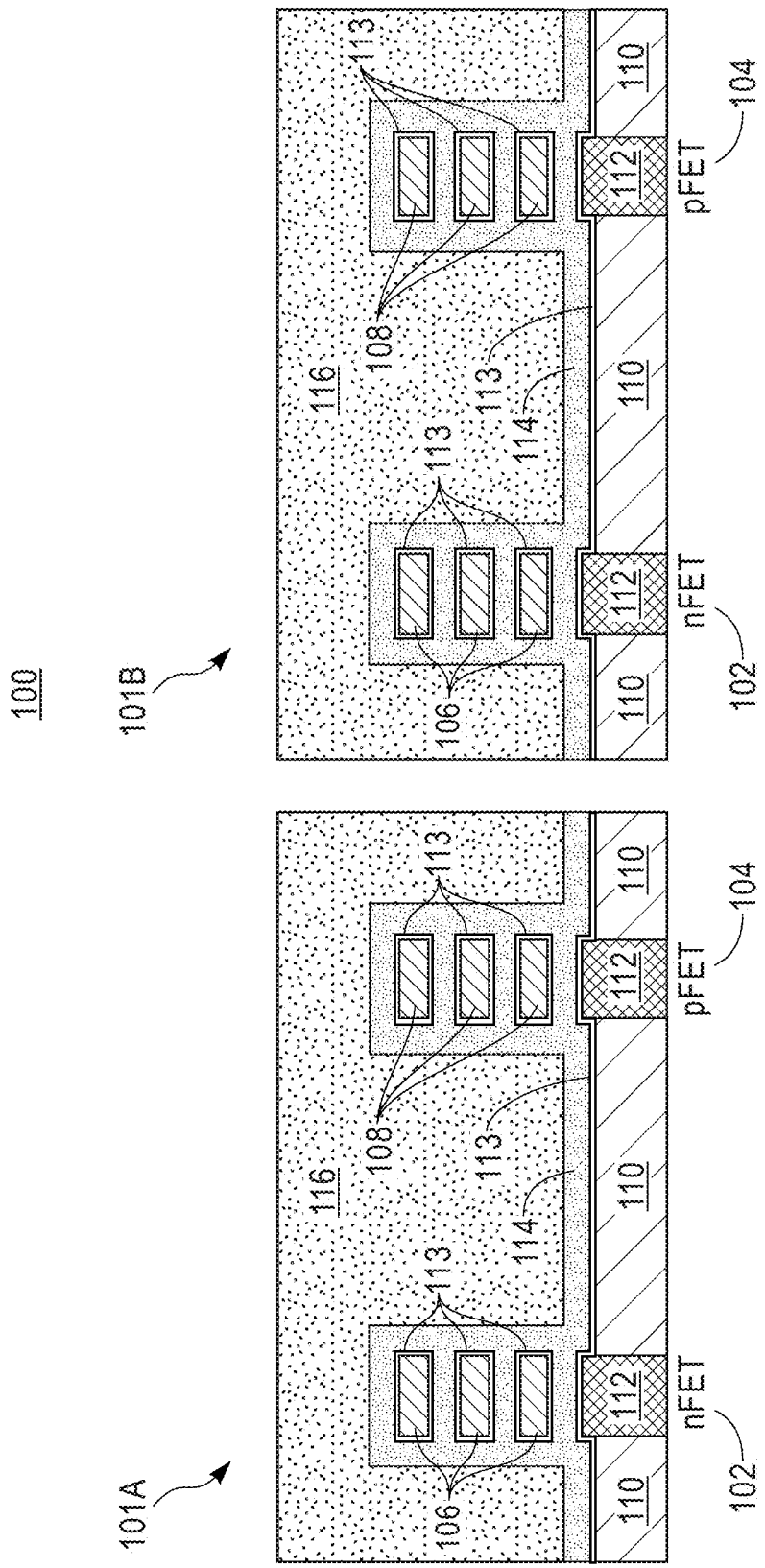
FIG. 17 is a cross-sectional view depicting two semiconductor structures at an intermediate stage of the manufacturing process, in accordance with embodiments of the present disclosure.

Turning now to FIG. 17, shown is an intermediate structure 100 that includes two regions 101A, 101B (collectively and individually referred to as region(s) 101) in a single wafer, in accordance with embodiments of the present disclosure. Each region 101 includes an nFET region 102 and a pFET region 104. The regions 101 include an epitaxially grown multilayer structure of Si and SiGe layers that can be configured and arranged such that the Si channels 106 are provided in the nFET region 102 and the SiGe channels 108 are provided in the pFET region 104. The nFET region 102 and the pFET region 104 are separated by a shallow trench isolation region 110 formed of an oxide, for example. The illustrated nFET and pFET regions 102, 104 include three nanosheets within the multilayer structure spaced apart from a base substrate 112. Although three nanosheets are depicted in each region 102, 104, this is done for illustrative purposes only. As would be recognized by a person of ordinary skill, fewer than or greater than the three nanosheets can be present as can be desired for different nFET and pFET nanosheet structures. A dielectric layer 103 and p-type work function metal 114 are conformally deposited onto the structure 100.

Figure 18:
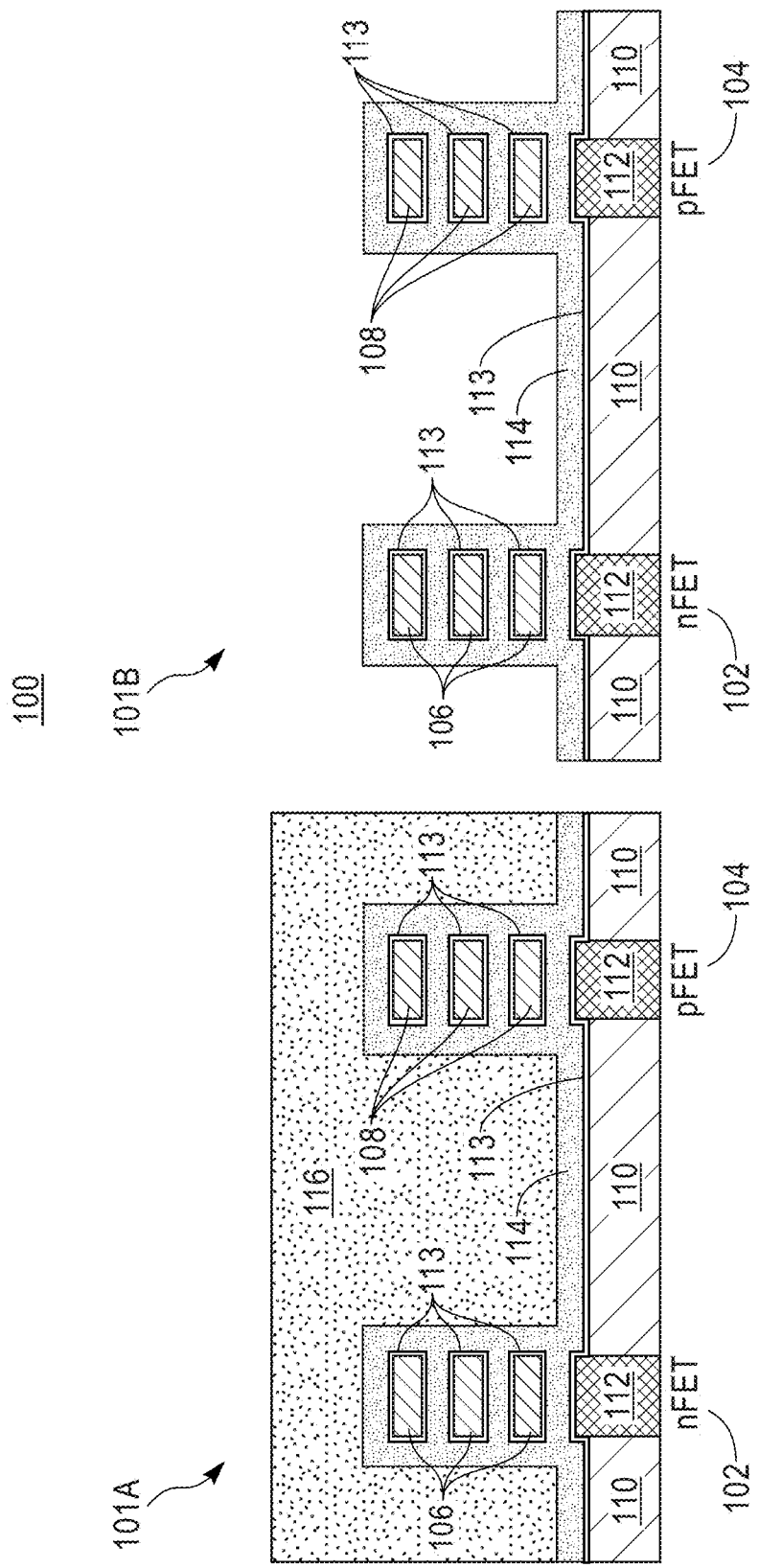
FIG. 18 is a cross-sectional view depicting the two semiconductor structures of FIG. 17 after one or more additional fabrication operations, in accordance with embodiments of the present disclosure.
Figure 19:
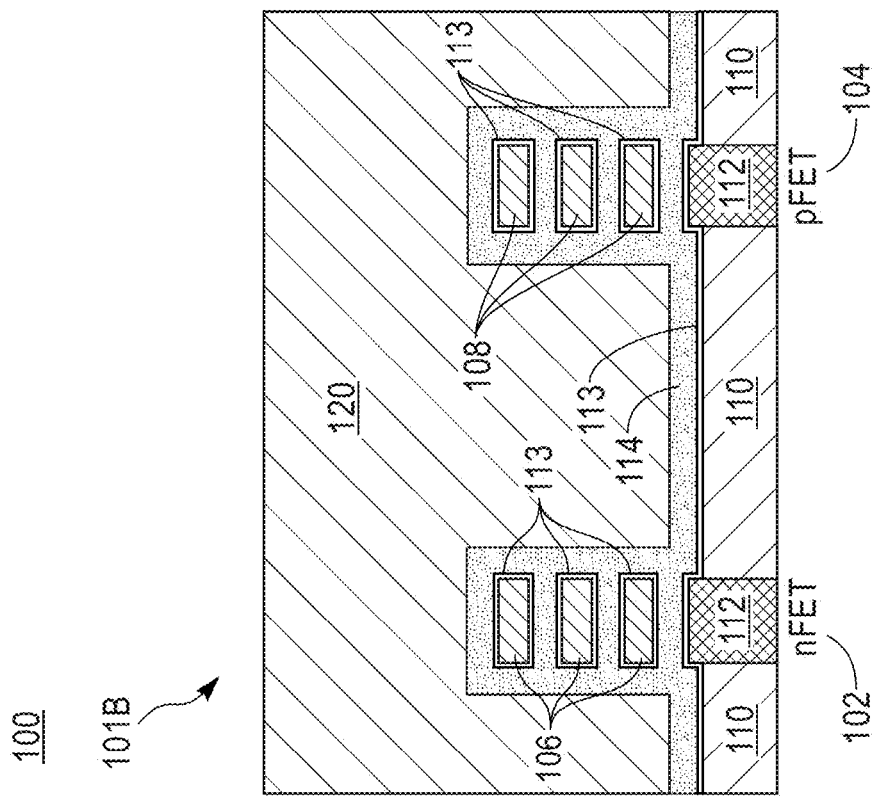
FIG. 19 is a cross-sectional view depicting the two semiconductor structures of FIG. 18 after one or more additional fabrication operations, in accordance with embodiments of the present disclosure.
Figure 19:
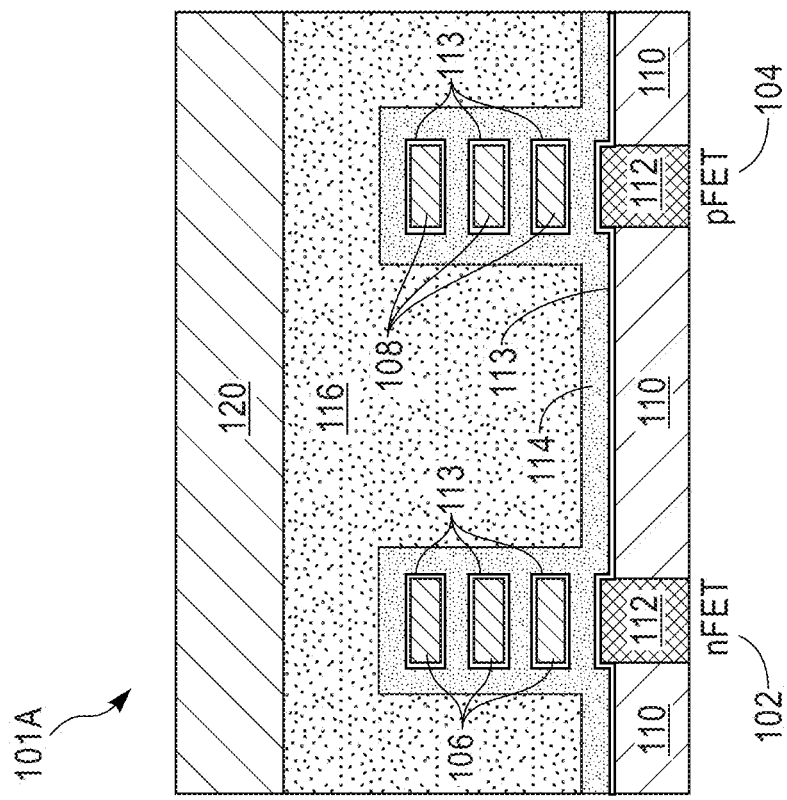

FIG. 18 illustrates the nanosheet FET structure 100 of FIG. 17 subsequent to removal of the first OPL 116 from the second region 101B. FIG. 19 illustrates the nanosheet FET structure 100 of FIG. 18 subsequent to deposition of a second OPL 120 onto the structure 100. The second OPL 120 can be deposited using a spin coat process. In some embodiments, the second OPL 120 can then be subjected to a crosslinking operation. For example, The second OPL 120 may comprise a UV sensitive material with reversible de-crosslinking properties. As such, UV light (e.g., at 365 nm) may be applied to the second OPL 120 to cause the second OPL 120 to crosslink.

In some embodiments of the present disclosure, the first OPL 116 and the second OPL 120 may have different properties. For example, the first OPL 116 may include a mixture of materials such that 50% of the first OPL 116 is thermally crosslinking (an irreversible reaction) and 50% of the first OPL 116 is a UV sensitive material (e.g., reversibly UV crosslinking). Meanwhile, the second OPL 120 may entirely comprises a reversible UV crosslinking material, as disclosed herein. This may be done when one region of the wafer (e.g., the first region 101A) is a loose pitch sheet area and the other region of the wafer (e.g., the second region 101B) is a tight pitch sheet area. In other words, different OPLs may be used in different parts of the wafer, depending on the pitch sizes of the structures being formed in those parts of the wafter. It is to be understood that while the example embodiment shown in FIGS. 17-25 contain two regions 101, this is done for illustrative purposes only. Embodiments having more or fewer regions, and/or more or fewer different types of OPL, are contemplated.

Figure 20:
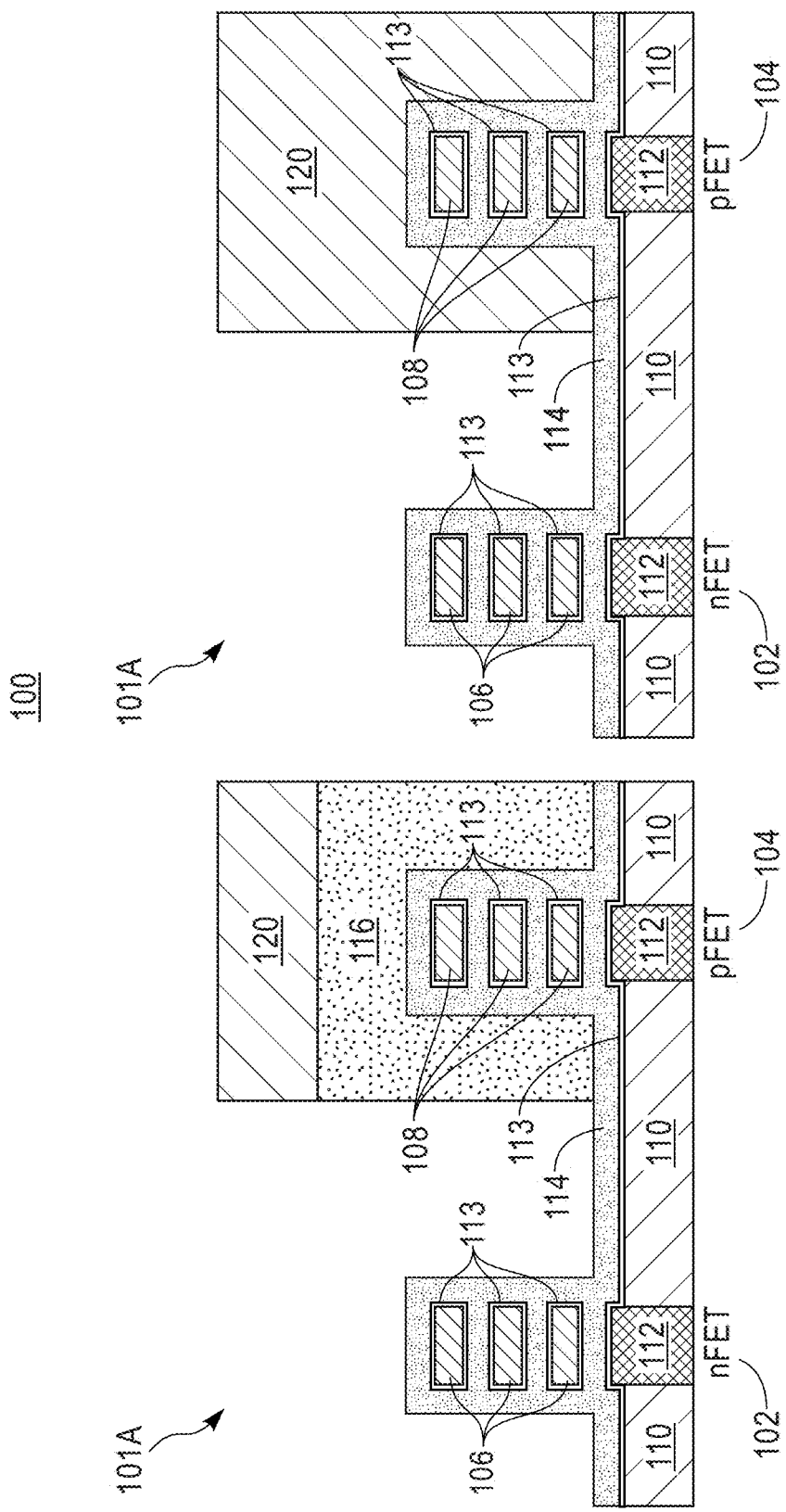
FIG. 20 is a cross-sectional view depicting the two semiconductor structures of FIG. 19 after one or more additional fabrication operations, in accordance with embodiments of the present disclosure.

The OPLs 116, 120 can be lithographically patterned to protect the pFET region 104 during subsequent to processing of the nFET region 102 using a hard mask and photoresist layer thereon. The OPLs 116, 120 after patterning is shown in FIG. 20. As shown in FIG. 20, the OPLs 116, 120 have been removed from the nFET region 102 and are only present in the pFET region 104.

Figure 21:
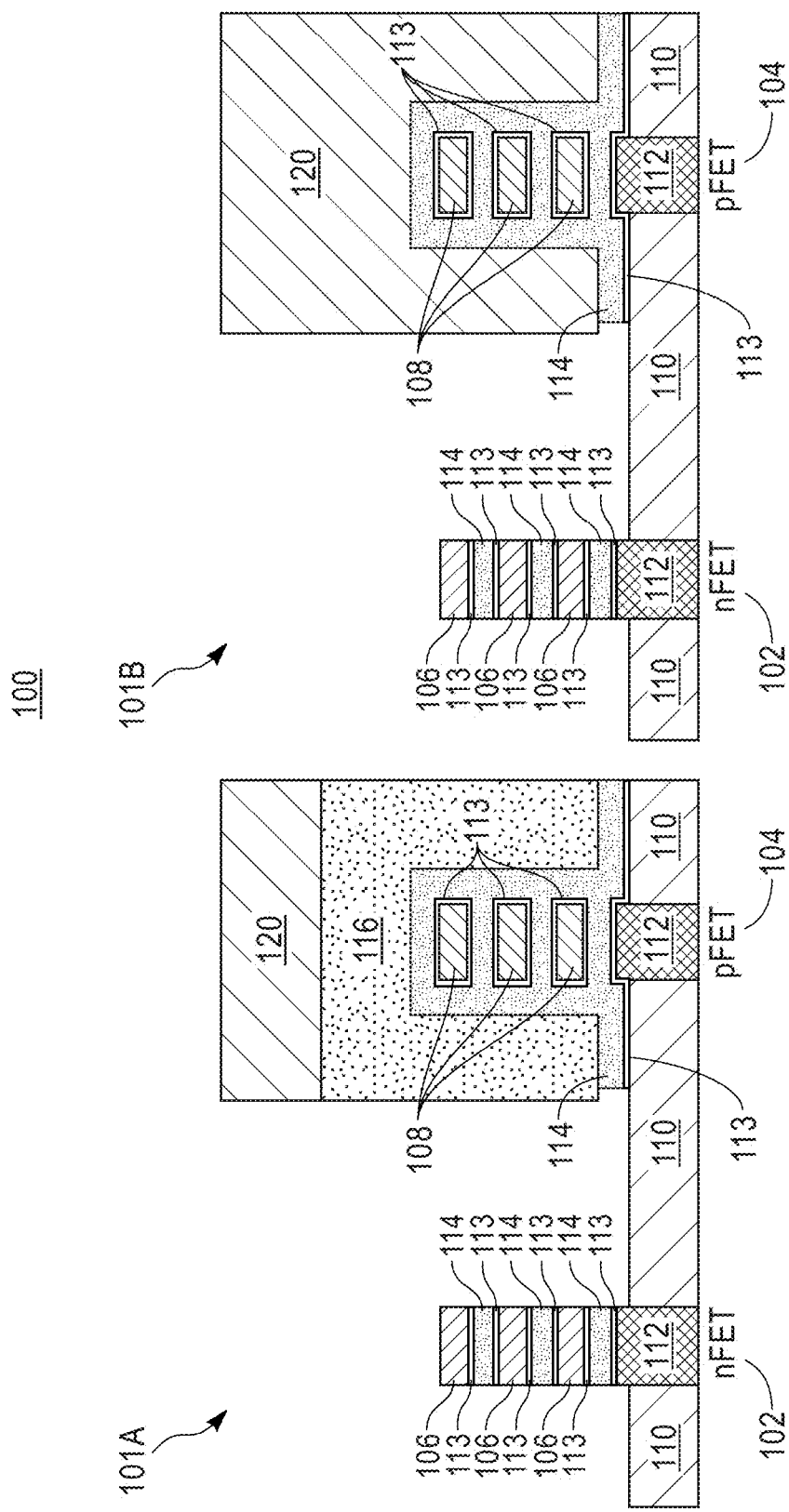
FIG. 21 is a cross-sectional view depicting the two semiconductor structures of FIG. 20 after one or more additional fabrication operations, in accordance with embodiments of the present disclosure.

FIG. 21 illustrates the nanosheet FET structure of FIG. 20 subsequent to removal of a portion of the work function metal 114 (and high k dielectric layer 113) from the nFET region 102, which removes a nominal thickness deposited onto the structure. Removal of the exposed portions of the work function metal in the nFET region 102 can be effected using a wet etch process such as a standard clean SC-1 process, which generally includes exposing the substrate to an aqueous solution containing hydrogen peroxide (H2O2) and ammonium hydroxide (NH4OH) at a temperature of about room temperature to about 50° C. The removal process can further include exposing the substrate to a H2O2 solution at an elevated temperature followed by exposing the substrate to the SC-1 aqueous solution for a second time. Alternatively, a combination of the standard clean SC-1 process and a standard clean SC-2 process at an elevated temperature can be used. The standard clean SC-2 process generally includes exposing the substrate to an aqueous solution of hydrochloric acid (HCl) and H2O2. As shown, because the WFM underlying the OPLs 116, 120 includes an exposed end portion, lateral etching of the work function metal 114 in the pFET region 104 occurs resulting in undercutting of the OPLs 116, 120. The extent of undercutting is about 2 nm to about 10 nm.

Figure 22:
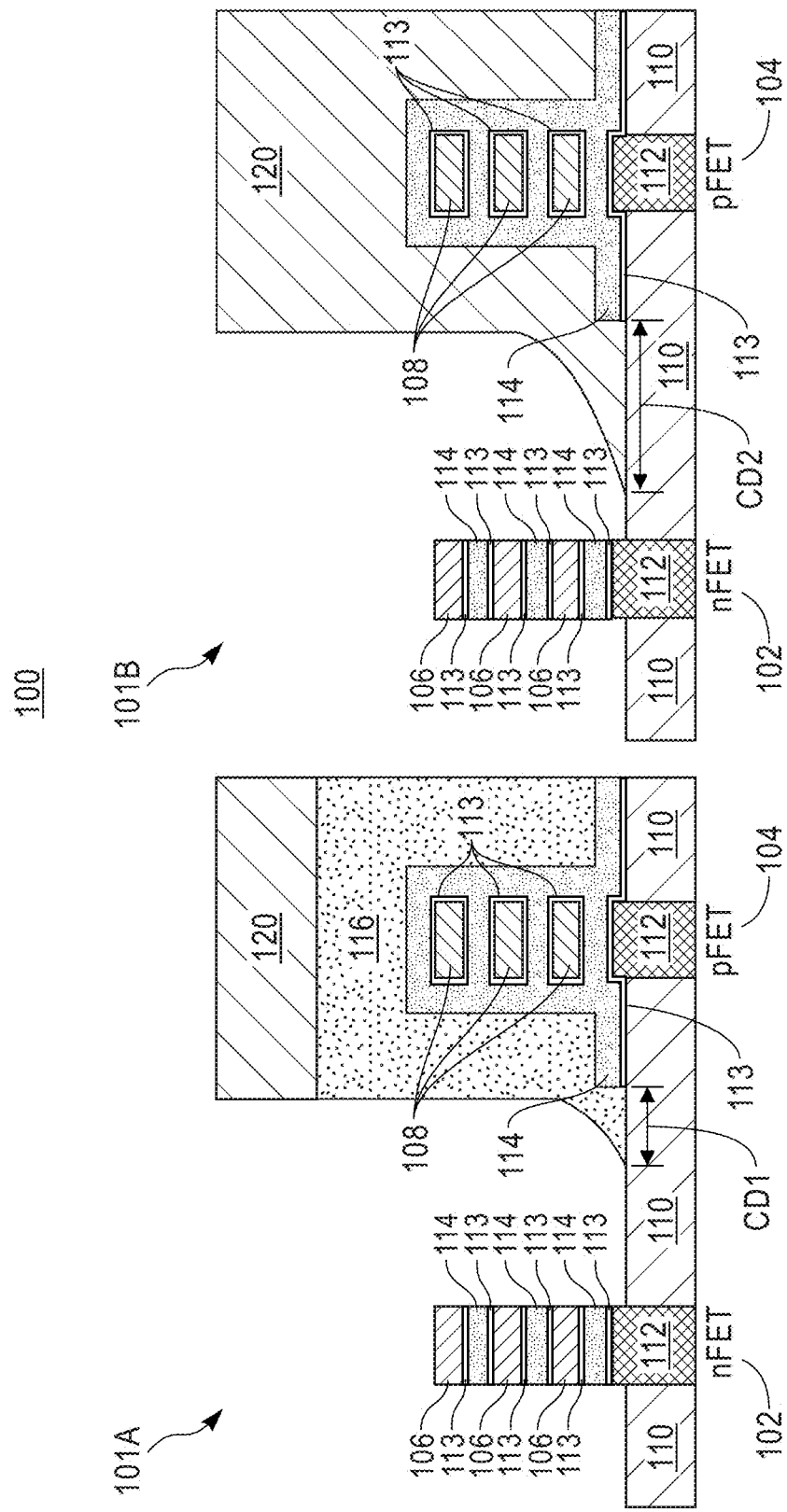
FIG. 22 is a cross-sectional view depicting the two semiconductor structures of FIG. 21 after one or more additional fabrication operations, in accordance with embodiments of the present disclosure.

FIG. 22 illustrates the nanosheet FET structure of FIG. 21 subsequent to reflowing the OPLs 116, 120 so as to advantageously prevent further lateral etch of the work function metal 114 in the pFET region 104. As noted above, the OPLs 116, 120 can be a UV sensitive material, and reflow of the OPLs 116, 120 can be effected through exposure to a de-crosslinking radiation. In some embodiments, a soft bake operation may also be performed by heating the OPLs 116, 120. This may occur simultaneous with the electromagnetic radiation application, or it may occur after. Heating the OPLs 116, 120 may further expedite the reflow process of the decrosslinked OPLs 116, 120. The reflow of the organic planarization is in an amount effective to completely cover the exposed portion of the work function metal 114 in the pFET region 104, as shown.

As shown in FIG. 22, the distance that the OPLs 116, 120 reflow is different in each region 101. For example, the first OPL 116 in the first region 101A reflows to a critical distance of CD1. Meanwhile, the second OPL 120 in the second region 101B reflows to a second critical distance CD2. The second critical distance CD2 is larger than the first critical distance CD1. This is because the second OPL 120 is made up of a material that has higher reflow capability (e.g., is 100% UV sensitive), whereas the first OPL 116 is only made up of a material or combination of materials with a lower reflow capability (e.g., that is only 50% UV sensitive). Accordingly, the first OPL 116 may not entirely de-crosslink, and therefore its flow is smaller. This may be particularly advantageous when the distance between the nFET region 102 and the pFET region 104 is small as the reflowing OPL 116 is unlikely to interfere with the nFET region 102. In other words, keeping the size of the reflow region of the first OPL 116 small allows for smaller pitches between the nFET region 102 and the pFET region 104 because the reflowed OPL 116 is less likely to interfere with the removal of the work function metal 114 from the nFET region 102.

Figure 26:
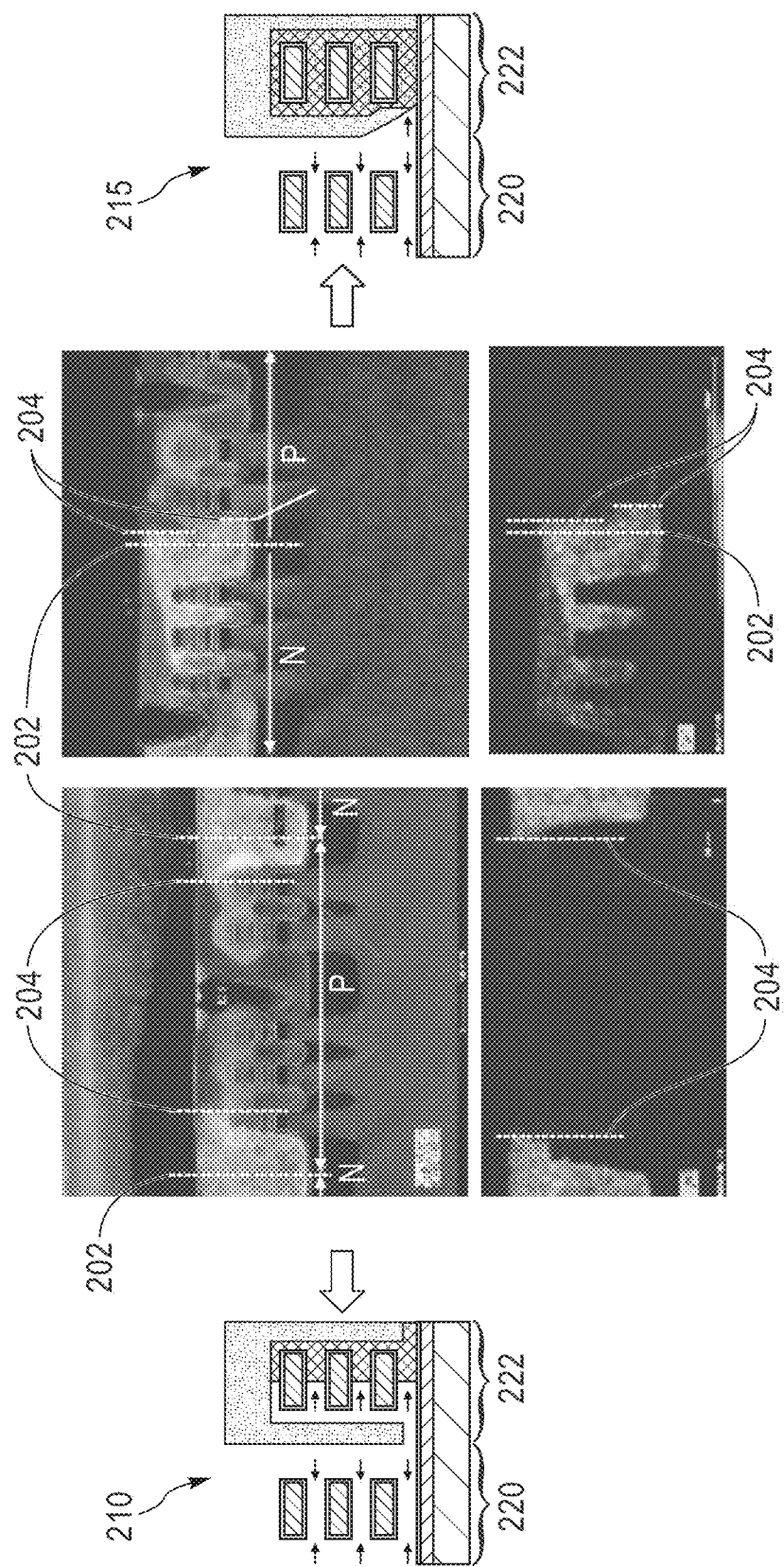
FIG. 26 depicts scanning electron micrographs of N/P boundaries for nanosheet field effect transistors fabricated without a reflow operation and with an inadequate reflow operation, in accordance with embodiments of the present disclosure.

On the other hand, when tolerances are less strict, it may be more advantageous to use a 100% reversible UV crosslinking material, such as the second OPL 120. This is because inadequate reflow of the OPL 120 may result in some undercutting of the work function metal 114 from the pFET region, as shown in FIG. 26. The higher reflow region of the second OPL 120 ensures that the pFET region 104 will be fully protected from such undercutting.

It is to be understood that the second OPL 120 (if not removed) is likely to also reflow in the first region 101A of the structure 100. However, because the second OPL 120 would have considerably less volume in the first region 101A, as well as a long vertical distance to travel before beginning to travel towards the nFET region 102, reflow of the second OPL 120 in the first region 101A is unlikely to add to the critical distance CD1, and it has been omitted from FIG. 22.

After the reflow process has completed and the OPLs 116, 120 have flowed such that the work function metal 114 in the pFET region 104 is protected, the OPLs 116, 120 may be re-crosslinked so as to "set" the OPLs 116, 120. Re-crosslinking the OPLs 116, 120 may include, for example, subjecting the OPLs 116, 120 to UV radiation having a 365 nm wavelength for a certain amount of time, depending on the thickness of the OPLs 116, 120 and the specific materials selected. In some embodiments, the first and second OPLs 116 and 120 may have different re-crosslink wavelengths, and the re-crosslink operation may include subjecting the OPLs 116, 120 to UV radiation of both wavelengths.

Figure 23:
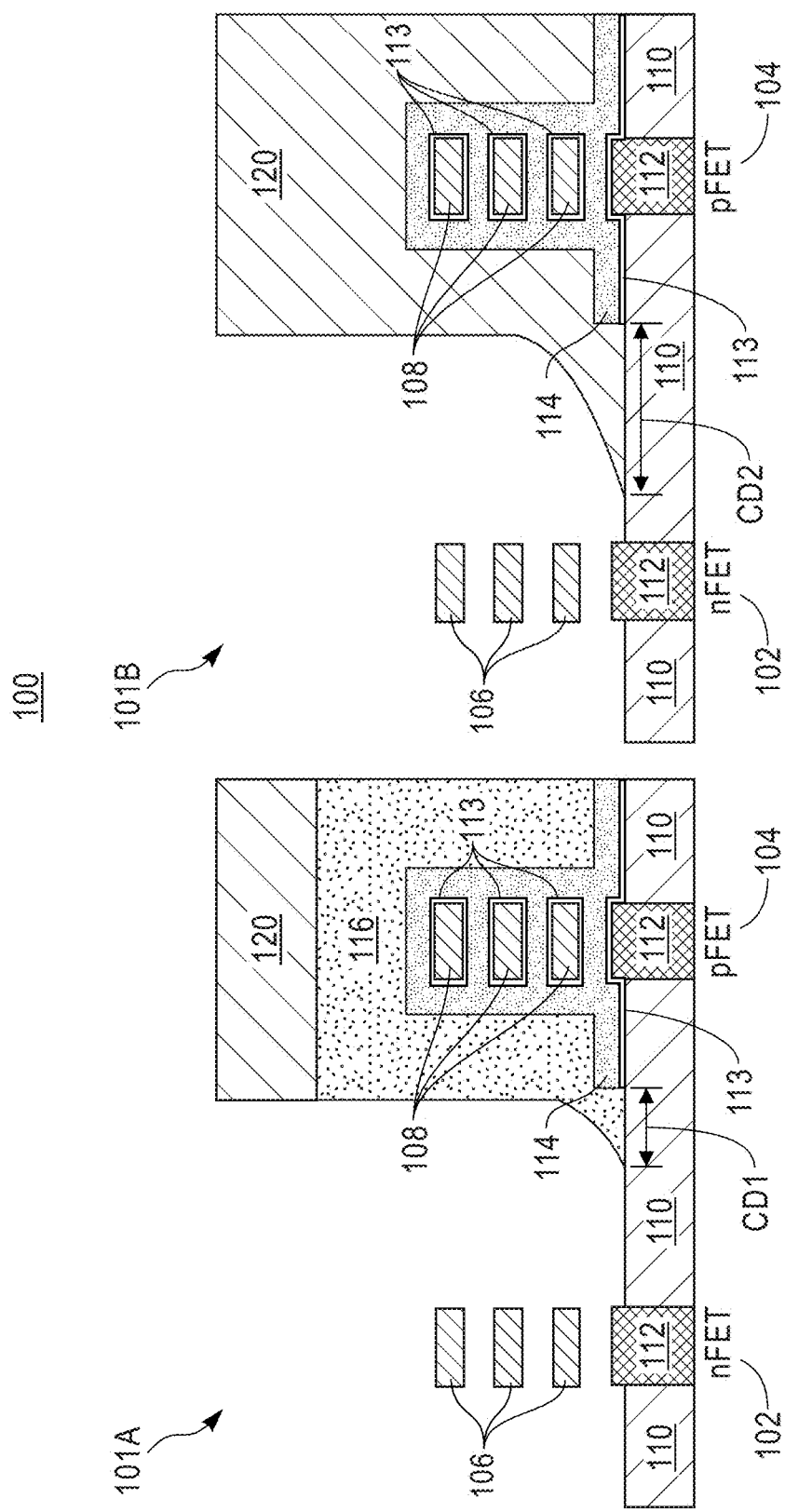
FIG. 23 is a cross-sectional view depicting the two semiconductor structures of FIG. 22 after one or more additional fabrication operations, in accordance with embodiments of the present disclosure.

FIG. 23 illustrates the nanosheet FET structure of FIG. 22 subsequent to full removal of the work function metal 114 from between the nanosheets 106 within the nFET region 102. In the pFET region 104, the work function metal 114 is completely encapsulated and protected by the reflowed OPLs 116, 120. Without reflow of the OPLs 116, 120, the undercut can be from about 20 nm to about 40 nm.

Figure 24:
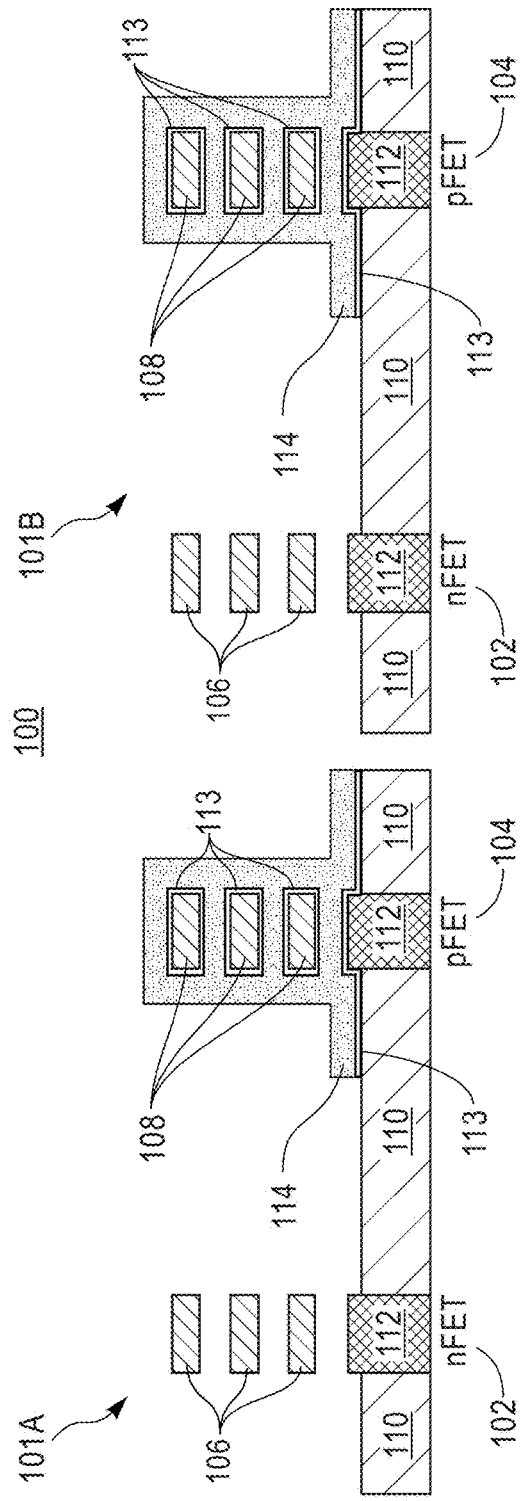
FIG. 24 is a cross-sectional view depicting the two semiconductor structures of FIG. 23 after one or more additional fabrication operations, in accordance with embodiments of the present disclosure.
Figure 25:
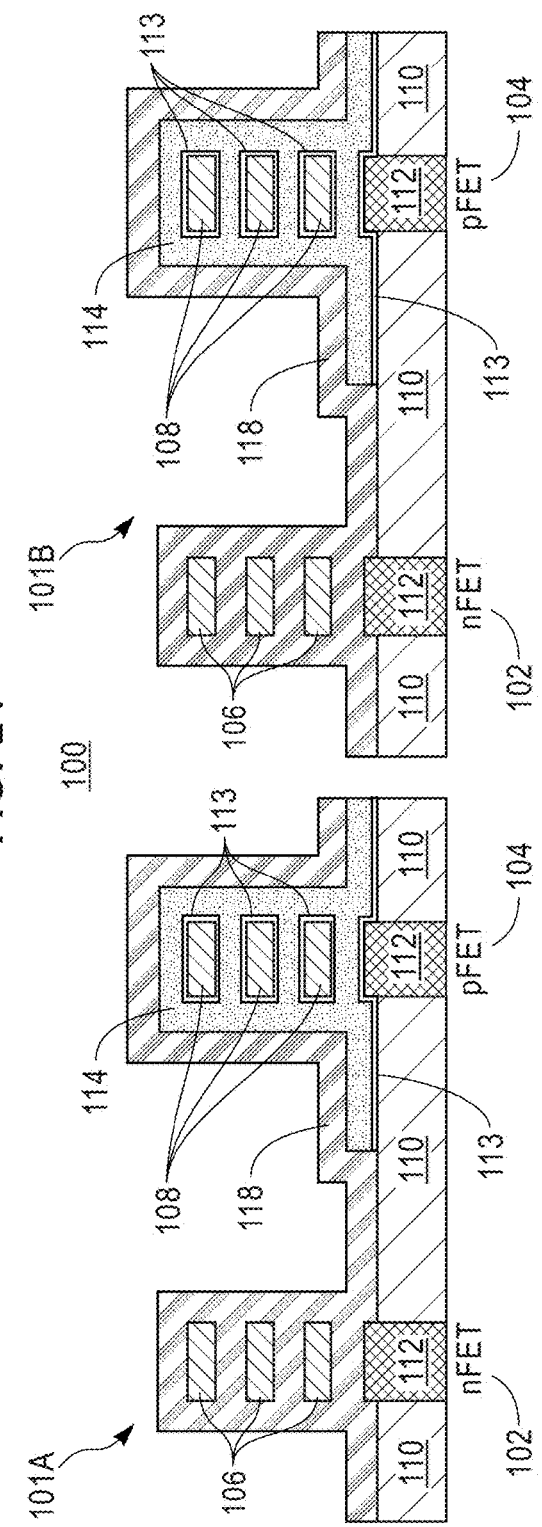
FIG. 25 is a cross-sectional view depicting the two semiconductor structures of FIG. 24 after one or more additional fabrication operations, in accordance with embodiments of the present disclosure.

FIG. 24 illustrates the nanosheet FET structure of FIG. 23 subsequent to stripping the OPLs 116, 120 from the pFET region 104. FIG. 25 illustrates the nanosheet FET structure of FIG. 24 subsequent to conformal deposition of an n-type work function metal 118 on the structure. The nFET and pFET regions 102, 104 undergo further conventional fabrication steps to complete the respective nanosheet FETs, including formation of top source/drain regions (not shown).

FIG. 26 are scanning electron micrographs of N/P boundaries of nanosheet field effect transistors fabricated without a reflow operation and with an inadequate reflow operation. In particular, the micrographs on the left show a nanosheet FET fabricated without any reflow operation, and the micrographs on the right show a nanosheet FET fabricated with an inadequate reflow operation that resulted in the work function metal of the pFET region being inadequate protected.

In the micrographs on the left, the ideal N/P boundaries 202 and the actual N/P boundaries 204 are shown by the dotted lines. As can be seen from the micrographs, the actual N/P boundaries are on top of the pFETs instead of in the ideal locations. This is because the wet etching stage that removed the WFM from the nFET region substantially undercut into the pFET region. The diagram 210 to the left illustrates what such undercutting from of the pFET region 222 during wet etching of the nFET region 220 would look like.

Likewise, in the micrographs on the right, the ideal N/P boundaries 202 and the actual N/P boundaries 204 are shown by the dotted lines. As can be seen from the micrographs, the actual N/P boundaries are shifted from the ideal locations, though the amount of shifting is less than is seen on the left micrographs. This is because the wet etching stage that removed the WFM from the nFET region undercut into the pFET region, but to a much smaller degree than in the nanosheet FET that had no reflow at all. The diagram 215 to the right illustrates what such undercutting from of the pFET region 222 during wet etching of the nFET region 220 would look like.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for fabricating a semiconductor device, the method comprising:
conformally depositing a work function metal over channel structures provided in an nFET region and a pFET region of a semiconductor device;
depositing and patterning an organic planarizing layer to block the channel structures in a selected one of the nFET region and the pFET region;
removing a nominal thickness of the work function metal from the other one of the nFET and pFET region, wherein removing the nominal thickness laterally removes a portion of the work function metal to form an undercut in the organic planarizing layer;
reflowing the organic planarizing layer to fill the undercut and completely cover the work function metal underlying the organic planarizing layer by irradiating the organic planarizing layer;
irradiating, after reflowing the organic planarizing layer, the organic planarizing layer to re-crosslink the organic planarization layer; and
fully removing a remaining portion of work function metal from the other one of the nFET region and the pFET region, wherein fully removing the remaining work function metal does not remove any additional amount of the work function metal underlying the organic planarizing layer.

2. The method of claim 1, wherein the selected one is the pFET region and the work function metal is a p-type work function metal.

3. The method of claim 1, wherein the selected one is the nFET region and the work function metal is an n-type work function metal.

4. The method of claim 1, wherein removing the nominal thickness of the work function metal and removing fully the remaining work function metal comprise a wet etching process.

5. The method of claim 4, wherein the wet etching process comprises exposing the work function metal in the other one of the pFET region and the nFET region to an aqueous solution comprising at least one selected from the group consisting of ammonium hydroxide, hydrogen peroxide, hydrochloric acid, and a combination comprising at least one of the ammonium hydroxide, the hydrogen peroxide, and/or the hydrochloric acid.

6. The method of claim 1, wherein reflowing the organic planarizing layer comprises exposing the organic planarizing layer to activating radiation effective to decrosslink the organic planarizing layer.

7. The method of claim 6, wherein the activating radiation has a wavelength of approximately 256 nm.

8. The method of claim 1, wherein the channel structures include one or more selected from the group consisting of nanosheets, one or more vertical fins, and one or more horizontal fins.

9. A method for protecting a boundary between an nFET region and a pFET region in a semiconductor device, the method comprising:
depositing and patterning a UV sensitive organic planarizing layer to protect underlying structures formed in a selected one of the nFET region and the pFET region;
processing structures in the other one of the nFET region and the pFET region to form an undercut in the organic planarizing layer;
reflowing the UV sensitive organic planarizing layer to fill the undercut, wherein reflowing comprises exposing the UV sensitive organic planarizing layer to activating radiation effective to decrosslink the UV sensitive organic planarizing layer; and irradiating, after reflowing the UV sensitive organic planarizing layer, the UV sensitive organic planarizing layer to re-crosslink the UV sensitive organic planarization layer.

10. The method of claim 9, wherein the structures and the underlying structures comprise channels formed of nanosheets or vertical fins or horizontal fins.

11. The method of claim 9, wherein reflowing the UV sensitive organic planarizing layer is subsequent to a wet etch process to remove a nominal thickness of a work function metal from the other one of the pFET region and the nFET region.

12. The method of claim 11, wherein the selected one is the pFET region and the work function metal is a p-type work function metal.

13. The method of claim 11, wherein the selected one is the nFET region and the work function metal is an n-type work function metal.

14. The method of claim 9, wherein processing the structures to form the undercut in the UV sensitive organic planarizing layer comprises exposing a work function metal in the other one of the pFET region and the nFET region to wet etch process prior to reflowing the UV sensitive organic planarizing layer to fill the undercut.

15. A method for fabricating a semiconductor device, the method comprising:

depositing a first organic planarizing layer over underlying structures formed in a first portion of the semiconductor device;

depositing a second organic planarizing layer over underlying structures formed in a second portion of the semiconductor device;

patterning the first and second organic planarization layers to remove the first and second organic planarization layers from one of an nFET region or a pFET region in each of the first and second portions of the semiconductor device;

processing structures in an other one of the nFET region or the pFET region in each of the first and second portions of the semiconductor device to form an undercut in the first and second organic planarizing layers; and reflowing the organic planarizing layers to fill the undercuts, wherein reflowing comprises decrosslinking the organic planarizing layers by exposing the organic planarizing layers to activating radiation in an amount effective to cause the decrosslinking and reflow of the organic planarizing layers.

16. The method of claim 15, wherein the structures and the underlying structures comprise channels formed of nanosheets or vertical fins or horizontal fins.

17. The method of claim 15, wherein reflowing the organic planarizing layers is subsequent to a wet etch process to remove a nominal thickness of a work function metal from the other one of the pFET region and the nFET region.

18. The method of claim 17, wherein the selected one is the pFET region and the work function metal is a p-type work function metal.

19. The method of claim 15, wherein processing the structures to form the undercut in the organic planarizing layers comprises exposing a work function metal therein in the other one of the pFET region and the nFET region to wet etch process prior to reflowing the organic planarizing layers to fill the undercut.

\* \* \* \* \*